United States Patent
Park et al.

(10) Patent No.: US 11,339,497 B2
(45) Date of Patent: May 24, 2022

(54) SILICON CARBIDE INGOT MANUFACTURING METHOD AND SILICON CARBIDE INGOT MANUFACTURED THEREBY

(71) Applicant: SENIC INC., Cheonan-si (KR)

(72) Inventors: Jong Hwi Park, Suwon-si (KR); Kap-Ryeol Ku, Suwon-si (KR); Jung-Gyu Kim, Suwon-si (KR); Jung Woo Choi, Suwon-si (KR); Sang Ki Ko, Suwon-si (KR); Byung Kyu Jang, Suwon-si (KR); Eun Su Yang, Suwon-si (KR); Jung Doo Seo, Suwon-si (KR)

(73) Assignee: SENIC INC., Cheonan-si (KR)

( * ) Notice: Subject to any disclaimer, the term of this patent is extended or adjusted under 35 U.S.C. 154(b) by 0 days.

(21) Appl. No.: 17/408,727

(22) Filed: Aug. 23, 2021

(65) Prior Publication Data

US 2022/0064817 A1    Mar. 3, 2022

(30) Foreign Application Priority Data

Aug. 31, 2020 (KR) .......... 10-2020-0110065
Nov. 27, 2020 (KR) .......... 10-2020-0162868

(51) Int. Cl.
*C30B 23/06* (2006.01)
*C30B 23/00* (2006.01)
*C30B 29/36* (2006.01)

(52) U.S. Cl.
CPC ............ *C30B 23/002* (2013.01); *C30B 23/06* (2013.01); *C30B 29/36* (2013.01)

(58) Field of Classification Search
CPC ........ C30B 23/06; C30B 29/36; C30B 23/002
See application file for complete search history.

(56) References Cited

U.S. PATENT DOCUMENTS

| | | |
|---|---|---|
| 2010/0086466 A1 | 4/2010 | Ceran |
| 2012/0103249 A1* | 5/2012 | Gupta .................. C30B 23/005 |
| | | 117/89 |
| 2016/0208412 A1 | 7/2016 | Sandgren et al. |

(Continued)

FOREIGN PATENT DOCUMENTS

| | | |
|---|---|---|
| CN | 106906515 A | 6/2017 |
| EP | 2 857 562 A1 | 4/2015 |

(Continued)

OTHER PUBLICATIONS

Korean Office Action dated Dec. 1, 2020 in counterpart Korean Patent Application No. 10-2020-0110065 (8 pages in English and 5 pages in Korean).

(Continued)

*Primary Examiner* — Hua Qi
(74) *Attorney, Agent, or Firm* — NSIP Law

(57) ABSTRACT

A silicon carbide ingot manufacturing method and a silicon carbide ingot manufacturing system are provided. The silicon carbide ingot manufacturing method and the silicon carbide ingot manufacturing system may change a temperature gradient depending on the growth of an ingot by implementing a guide which has a tilted angle to an external direction from the interior of a reactor, in an operation to grow an ingot during a silicon carbide ingot manufacturing process.

5 Claims, 13 Drawing Sheets

(56) References Cited

U.S. PATENT DOCUMENTS

| | | | | |
|---|---|---|---|---|
| 2017/0137962 A1* | 5/2017 | Ma | ............... | C30B 23/025 |
| 2019/0194819 A1* | 6/2019 | Fujikawa | ............... | C30B 35/002 |

FOREIGN PATENT DOCUMENTS

| | | | | |
|---|---|---|---|---|
| JP | 2002-60297 | A | | 2/2002 |
| JP | 2002060297 | A | * | 2/2002 |
| JP | 2006-96578 | A | | 4/2006 |
| JP | 2007-204309 | A | | 8/2007 |
| JP | 2008-110907 | A | | 5/2008 |
| JP | 2008110907 | A | * | 5/2008 |
| JP | 2010-111521 | A | | 5/2010 |
| JP | 2010-515661 | A | | 5/2010 |
| JP | 2010-241628 | A | | 10/2010 |
| JP | 2012-91967 | A | | 5/2012 |
| JP | 2012-214376 | A | | 11/2012 |
| JP | 2013-166672 | A | | 8/2013 |
| JP | 2014-101246 | A | | 6/2014 |
| JP | 2015-224169 | A | | 12/2015 |
| JP | 2016-11215 | A | | 1/2016 |
| JP | 2018-16498 | A | | 2/2018 |
| JP | 2018-016542 | A | | 2/2018 |
| JP | 6489891 | B2 | | 3/2019 |
| JP | 2019-91798 | A | | 6/2019 |
| JP | 2019-119623 | A | | 7/2019 |
| KR | 10-2013-0000294 | A | | 1/2013 |
| KR | 10-2013-0124023 | A | | 11/2013 |
| KR | 10-1339377 | B1 | | 12/2013 |
| KR | 10-1530057 | B1 | | 6/2015 |
| KR | 10-1640313 | B1 | | 7/2016 |
| KR | 10-1742103 | B1 | | 5/2017 |
| KR | 10-1744287 | B1 | | 6/2017 |
| KR | 10-1760030 | B1 | | 8/2017 |
| KR | 101760030 | B1 | * | 8/2017 |
| KR | 10-1951136 | B1 | | 2/2019 |
| KR | 10-2020-0018037 | A | | 2/2020 |
| KR | 10-2104751 | B1 | | 4/2020 |
| KR | 10-2020-0075954 | A | | 6/2020 |
| WO | WO 01/63020 | A1 | | 8/2001 |
| WO | WO 2009/060561 | A1 | | 5/2009 |

OTHER PUBLICATIONS

Korean Notice of Allowance dated Apr. 1, 2021 in counterpart Korean Patent Application No. 10-2020-0110065 (2 pages in English and 2 pages in Korean).

* cited by examiner

C. Example A

C. Example B

SILICON CARBIDE INGOT MANUFACTURING METHOD AND SILICON CARBIDE INGOT MANUFACTURED THEREBY This application claims the benefit under 35 USC 119(a) of Korean Patent Application No. 10-2020-0110065 filed on Aug. 31, 2020, and Korean Patent Application No. 10-2020-0162868, filed on Nov. 27, 2020, in the Korean Intellectual Property Office, the entire disclosures of which are incorporated herein by reference for all purposes.

BACKGROUND

1. Field

The following disclosure relates to a silicon carbide ingot manufacturing method, and a silicon carbide manufactured according to the method.

2. Description of Related Art

Silicon carbide (SiC) has excellent heat resistance and mechanical strength, and is physically and chemically stable, so that it is beneficial as a semiconductor material. Recently, as a substrate for high power devices, the demand of silicon carbide single crystal substrates has increased.

As a method for preparing a silicon carbide single crystal, there are Liquid Phase Epitaxy (LPE), Chemical Vapor Deposition (CVD), Physical Vapor Transport (PVT), and similar methods. Among them, the PVT is a method of growing a silicon carbide single crystal as follows: loads a silicon carbide raw material into a crucible, disposes a seed crystal composed of a silicon carbide single crystal on the top of the crucible, and then heat the crucible by an induction heating method to sublimate the raw material to grow the silicon carbide single crystal on the seed crystal.

PVT is the most widely used for the preparation of silicon carbide in the form of an ingot because it has a high growth rate. However, the temperature distribution inside a crucible may change depending on the temperature gradient condition during induction heating of the crucible, the relative position of a heater, the temperature difference between the top of the crucible and the bottom of the crucible, etc., thereby affecting the quality of the manufactured silicon carbide ingot.

Accordingly, in order to improve the crystal quality of the silicon carbide ingot and secure the reproducibility of manufacturing the ingot, it is beneficial to sufficiently consider factors that may affect the temperature distribution inside the crucible during ingot growing procedure.

The above information disclosed in this Background section is only for enhancement of understanding of the background of the invention, and therefore it may contain information that does not form the related art that is already known in this country to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a general aspect, a silicon carbide ingot manufacturing method includes a preparation operation of disposing a silicon carbide raw material and a silicon carbide seed crystal in an internal space of a reactor, and adjusting the internal space of the reactor to a vacuum atmosphere; a proceeding operation of injecting an inert gas into the internal space of the reactor, sublimating the silicon carbide raw material in the internal space of the reactor through a heater configured to surround the reactor, and configured to induce a silicon carbide ingot to be grown; and a cooling operation of cooling a temperature of the internal space of the reactor to room temperature, cutting a rear region of the silicon carbide ingot in contact with the seed crystal to retrieve the silicon carbide ingot; wherein the internal space of the reactor comprises a guide disposed to surround a circumferential surface of the silicon carbide seed crystal with a predetermined interval, wherein the guide is configured to extend toward a direction that faces a silicon carbide raw material from the silicon carbide seed crystal, the guide is configured to have a guide angle of inclination which is tilted to an external side of the silicon carbide seed crystal by −4° to 50° when a virtual reference line connecting one side of the silicon carbide seed crystal and the silicon carbide raw material in a shortest distance is designated as 0°, wherein the proceeding operation comprises a procedure in which the heater is moved, and wherein the moving of the heater comprises moving the heater to a relative position which becomes more distant at a rate of 0.1 mm/hr to 0.48 mm/hr based on the silicon carbide seed crystal, wherein the silicon carbide ingot comprises a front region and the rear region, the silicon carbide ingot has a maximum height equal to or greater than 15 mm in a direction perpendicular to the rear region, the silicon carbide ingot has a ratio, Df/Db, of 0.95 to 1.17, wherein Db is a diameter of the rear region, and Df is a diameter of the circumference of the front region, and the silicon carbide ingot has an angle of −4° to 50° between a line perpendicular to the rear region from one side of the circumference of the rear region, and an edge line linking one side of the front region, which is close to the one side of the circumference of the rear region, from a plane comprising the line perpendicular to the rear region from one side of the circumference of the rear region and the diameter of the rear region.

The angle of inclination of the guide may be 4° to 25°.

The reactor may include a heat insulating material configured to surround an external surface of the reactor, the heat insulating material may include a heat insulating circumference part that surrounds a circumferential surface of the reactor, and a volume of the reactor Vc and a volume of the heat insulating circumference part Vi may have a ratio Vc/Vi of 0.05 to 0.8.

The guide that surrounds the circumferential surface of the silicon carbide seed crystal may have a height equal to or greater that 30 mm, based on a direction connecting one side of the silicon carbide seed crystal and the silicon carbide raw material in a shortest distance.

The proceeding operation may sequentially include a pre-growth process and a growth process, the pre-growth process may sequentially include a first process, a second process, and a third process, the first process changes the vacuum atmosphere of the preparation operation to an inert atmosphere, the second process raises the temperature of the internal space of the reactor with the heater, and the third process depressurizes a pressure of the internal space of the reactor to reach a growth pressure based on the heating of the internal space of the reactor so that the temperature of the internal space of the reactor reaches the growth temperature, the growth process may be a process of maintaining the internal space of the reactor at the growth temperature and the growth pressure, and inducing the ingot to grow, a moving of the heater may be performed in the growth process, wherein a temperature difference may be a difference between an upper temperature of the internal space of the reactor and a lower temperature of the internal space of the reactor, and wherein the temperature difference in the growth process is 110° C. to 160° C.

The proceeding operation may sequentially include a pre-growth process and a growth process, the pre-growth process may sequentially include a first process, a second process, and a third process, the first process changes the vacuum atmosphere of the preparation operation to an inert atmosphere, the second process raises the temperature of the internal space of the reactor with the heater, and the third process depressurizes a pressure of the internal space of the reactor to reach a growth pressure based on a heating of the internal space of the reactor so that the temperature of the internal space of the reactor reaches a growth temperature, the growth process may be a process of maintaining the internal space of the reactor at the growth temperature and the growth pressure, and inducing the ingot to grow, a moving of the heater may be performed in the growth process, a temperature difference may be a difference between an upper temperature of the internal space of the reactor and a lower temperature of the internal space of the reactor, and the temperature difference in the growth process is 160° C. to 240° C.

The heat insulating circumference part of the heat insulating material may have a thickness of 200 mm to 600 mm.

In a general aspect, a silicon carbide ingot includes a front region and a rear region which is an opposite surface of the front region, wherein the rear region is a surface cut from a silicon carbide seed crystal, wherein the silicon carbide ingot includes a maximum height equal to or greater than 15 mm in a direction perpendicular to the rear region, wherein the silicon carbide ingot has a ratio, Df/Db, of 0.95 to 1.17, wherein Db is a diameter of the rear region and Df is a diameter of a circumference of the front region, wherein the silicon carbide ingot may have an angle of −4° to 50° between a line perpendicular to the rear region from one side of the circumference of the rear region, and an edge line linking one side of the front region, which may be close to the one side of the circumference of the rear region, from a plane comprising the line perpendicular to the rear region from one side of the circumference of the rear region and the diameter of the rear region. In a general aspect, a silicon carbide ingot manufacturing device includes a reactor, configured to have an internal space; a heat insulating material, disposed in an external surface of the reactor, and configured to surround the reactor; and a heater, configured to adjust one or more of a temperature of the reactor, and the internal space of the reactor, wherein the silicon carbide ingot manufacturing device includes a silicon carbide seed crystal located at an upper portion of the internal space of the reactor, wherein the silicon carbide ingot manufacturing device includes a silicon carbide raw material located at a lower portion of the internal space of the reactor, and wherein the silicon carbide ingot manufacturing device includes a mover, configured to change a relative position to an up-and-down direction between the heater and the reactor, wherein the internal space of the reactor includes a guide disposed to surround a circumferential surface of the silicon carbide seed crystal with a predetermined interval, wherein the guide may be configured to extend toward a direction that faces the silicon carbide raw material from the silicon carbide seed crystal, the guide may be configured to have a guide angle of inclination which is tilted to an external side of the silicon carbide seed crystal by −4° to 50° when a virtual reference line connecting one side of the silicon carbide seed crystal and the silicon carbide raw material in a shortest distance is designated as 0°, wherein the silicon carbide ingot manufacturing device may be configured to grow a silicon carbide ingot from the silicon carbide seed crystal, wherein the silicon carbide ingot manufactured by the silicon carbide ingot manufacturing device includes a front region and a rear region which is an opposite surface front region, wherein the rear region is a surface cut from a silicon carbide seed crystal, wherein the silicon carbide ingot may have a maximum height equal to or greater than 15 mm in a perpendicular direction to the rear region, wherein the silicon carbide ingot may have a ratio, Df/Db, of 0.95 to 1.17, wherein Db is a diameter of the rear region, and the Df is a diameter of the circumference of the front region, and wherein the silicon carbide ingot has an angle of −4° to 50° between a line perpendicular to the rear region from one side of the circumference of the rear region, and an edge line linking one side of the front region which is close to the one side of the circumference of the rear region from a plane comprising the line perpendicular to the rear region from one side of the circumference of the rear region and a diameter of the rear region.

The temperature of the heater during movement of the heater may be 2100° C. to 2500° C. based on a maximum heating region, the maximum heating region may be an internal region of the heater which has a predetermined length from a center of the heater to first and second ends of the heater, based on an arbitrary line linking the silicon carbide raw material and the silicon carbide seed crystal, the internal space of the reactor may include a sub-heating region located at an upper portion of the reactor, the sub-heating region may be an internal region of the heater which has a predetermined length from the center of the heater to the first and second ends of the heater, based on an arbitrary line linking the silicon carbide raw material and the silicon carbide seed crystal, and a temperature of the sub-heating region may be lower than a temperature of a maximum heating region by 110° C. to 160° C.

The heat insulating material may include a heat material circumference part configured to surround an external surface of the reactor, and a volume of the reactor Vc and a volume of the heat insulating material circumference part Vi may have a ratio, Vc/Vi, of 0.05 to 0.8.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
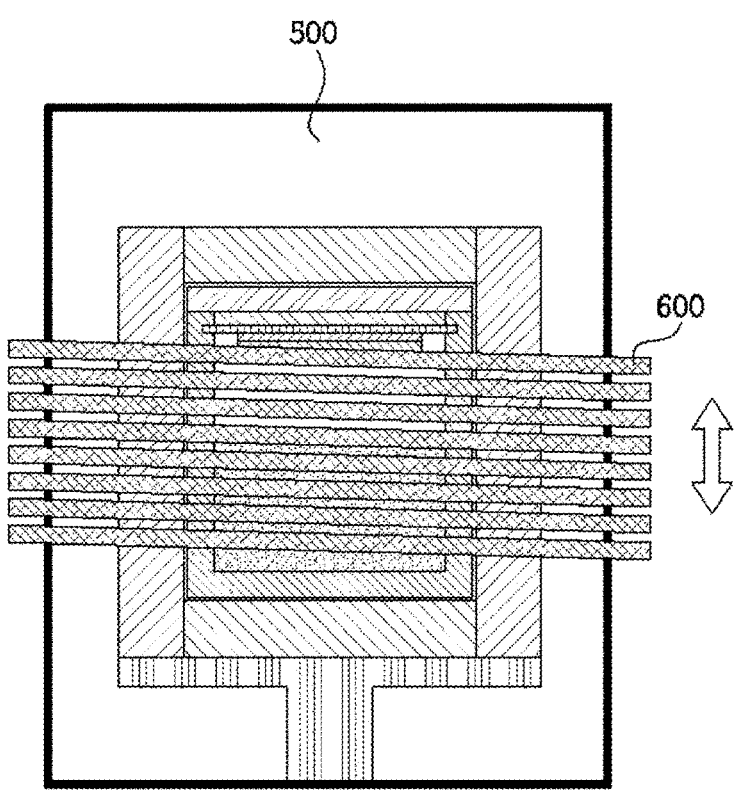
FIG. 1 is a conceptual view illustrating a silicon carbide ingot manufacturing system, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe vario us members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, the phrase "combination(s) thereof" included in a Markush-type expression denotes one or more mixtures or combinations selected from the group consisting of components stated in the Markush-type expression, that is, denotes that one or more components selected from the group consisting of the components are included.

In this application, a size and an angle illustrated in drawings are arbitrarily shown for easy description, and are not necessarily analyzed by being limited to the illustration.

In this application, a silicon carbide wafer refers to a silicon carbide wafer before formation of a so-called epitaxial layer which is a single crystal layer having a directivity (so-called bear wafer).

While the inventors consider a plan to minimize the occurrence of defects and cracks in the silicon carbide ingot and improve the silicon carbide ingot crystal quality, the inventors invented a method of manufacturing a silicon carbide ingot in which a guide unit is equipped inside a reactor that controls the shape of a silicon carbide ingot and the relative position of the heater is changed at a predetermined speed in the growth operation of the silicon carbide ingot. Hereinafter, the example embodiments will be described in more detail.

An object of example embodiments is to provide a manufacturing method for a silicon carbide ingot, which can exhibit a good quality and a system for manufacturing a silicon carbide ingot, by preparing a guide unit for inducing a shape of a silicon carbide ingot when grown during manufacturing processes of a silicon carbide ingot.

Another object of example embodiments is to provide a manufacturing method for a silicon carbide ingot, which can change a temperature gradient inside a reactor depending on growing of an ingot and a system for manufacturing a silicon carbide ingot, by moving a heating mean in a predetermined speed, in an operation of main growth of an ingot within manufacturing processes.

Another object of example embodiments is to provide a manufacturing method for a silicon carbide ingot, which is improved in a crystal quality and a silicon carbide ingot manufactured according to the method, by having a diameter ratio of the front and the rear of a silicon carbide ingot to be a certain value and having a certain angle of inclination in edges linking the front and the rear, through the above manufacturing method of a silicon carbide ingot and the like.

Another object of example embodiments is to provide a method and a system for manufacturing a silicon carbide ingot and a silicon carbide wafer having a good crystal quality and reducing defect occurrence.

A manufacturing method for a silicon carbide ingot, a system (manufacturing device) for manufacturing a silicon carbide ingot according to embodiments may improve a crystal quality of a manufactured silicon carbide ingot, by adjusting relative positions of a guide unit, which induces a growing shape of a silicon carbide ingot in a growth operation of a silicon carbide ingot, a reactor, and a heater at a predetermined speed.

According to embodiments, it is possible to secure a crystal quality of a manufactured silicon carbide ingot and minimize defect occurrence, by optimizing characteristics such as a volume ratio between a reactor and a heat insulating means, a temperature difference between an upper portion and a lower portion in a reactor, a density of a heat insulating material, a resistivity of a heat insulating material, and the like when a silicon carbide ingot and a wafer are manufactured.

A silicon carbide ingot manufactured according to embodiments has advantages that are lowering a defect density numerical value and hardly showing a crack or a crystal polymorphism, by having a certain angle in an edge linking the front and the rear, and having a certain value in a diameter ratio of the front and the rear.

Method of Manufacturing Silicon Carbide Ingot

In one general aspect, a method of manufacturing a silicon carbide ingot comprises, a preparation operation of disposing a silicon carbide raw material 300 and a seed crystal 110 in the internal space of a reactor 200 and adjusting the internal space to a vacuum atmosphere (Sa); a cooling operation of cooling the temperature of the internal space to room temperature (S2). The proceeding operation comprises a procedure in which the heater is moved.

The internal space comprises a guide unit 120 disposed to surround the circumference surface of the silicon carbide seed crystal 110 with a predetermined interval, The guide unit is extended toward a direction facing a silicon carbide raw material from the silicon carbide seed crystal 110, The guide unit has a guide angle of inclination which is tilted to an external side of the silicon carbide seed crystal 110 by −4° to 50° when a virtual reference line connecting one side of the silicon carbide seed crystal 110 and the silicon carbide raw material in the shortest distance is designated as 0°, and The moving of the heater 600 may have a relative position which becomes more distant at a rate of 0.1 mm/hr to 0.48 mm/hr based on the seed crystal.

The heater 600 and the reactor 200 may be installed to have a relative position changeable to an up-and-down direction. The relative position may be changed through the mover, and it may be changed when one or more of the heater 600 and the reactor are moved. Changing the relative position through movement of a heater 600 may be advantageous, not through a reactor's movement, for further stable growth of a silicon carbide ingot.

FIGS. 1, 3, 4, and 5, illustrate an example of a silicon carbide ingot system and a reactor 200. Referring to FIGS. 1, 3, 4, and 5, a method of manufacturing a silicon carbide ingot, in accordance with one or more embodiments, will be described.

The preparation operation (Sa) is an operation of disposing the raw material 300 and the silicon carbide seed crystals 110 to face each other in a reactor having an internal space and adjusting the internal space to have a vacuum atmosphere.

In the preparation operation (Sa), the pressure in the internal space may be reduced to be 50 torr or less, 10 torr or less, or 5 torr or less, as only examples, and the pressure may be reduced to be 1 torr or more. During the preparation operation (Sa) which includes such a vacuum atmosphere, it is possible to manufacture an ingot with more reduced defects.

The silicon carbide seed crystal 110 in the preparation operation (Sa) may be applied with an appropriate size according to the size of a target ingot. The C plane (000-1 plane) of the silicon carbide seed crystal 110 may be directed toward the raw material 300.

The silicon carbide seed crystal 110 in the preparation operation (Sa) may comprise 4 inches or more of 4H silicon carbide, or 6 inches or more of 4H silicon carbide, as only examples.

When the silicon carbide seed crystal 110 has a form attached to the seed crystal holder (not shown in drawings), the silicon carbide seed crystal 110 may further comprise an adhesive layer disposed on the rear region. When the silicon carbide seed crystal 110 has a form that is not directly adhered to the seed crystal holder, the silicon carbide seed crystal 110 may further comprise a protective layer disposed on the rear region. In this example, it is possible to induce growth of a silicon carbide ingot with more reduced defects.

The silicon carbide raw material 300 in the preparation operation (Sa) may be a raw material in the form of a powder having a carbon source and a silicon source, and the raw material may comprise silicon carbide powder.

The silicon carbide raw material 300 may comprise, as an example, a silicon carbide powder necked from each other or a silicon carbide powder in which the surface is carbonized. In this example, it is possible to help more efficient growth of silicon carbide by inducing more stable sublimation of silicon carbide during the growth process and the like.

The reactor 200 in the preparation operation (Sa) may be applied if it is a vessel suitable for growth reaction of a silicon carbide ingot, and specifically a graphite crucible may be applied. In an example, the reactor may comprise a body 210 comprising an internal space and an opening, and a cover 220 corresponding to the opening, thereby sealing the internal space. The cover 220 may further comprise a seed crystal holder formed integrally or separately from the cover 220, and the seed crystal holder may fix the silicon carbide seed crystal 110 so that the silicon carbide seed crystal 110 and the silicon carbide raw material 300 face each other.

The reactor 200 in the preparation operation (Sa) may comprise a guide unit 120 disposed in an internal space to surround the circumference surface of the silicon carbide seed crystal 110 with a predetermined interval.

The guide unit 120 may be extended toward a direction facing the silicon carbide seed crystal 110 to a silicon carbide raw material 300. The guide unit may have a guide angle of inclination which is tilted to an external side of the silicon carbide seed crystal 110 by −4° to 50° when a virtual reference line connecting one side of the silicon carbide seed crystal 110 and the silicon carbide raw material 300 in the shortest distance is designated as 0°. The guide angle of inclination may be 40° or less, or 25° or less. The guide angle of inclination may be 0.1° or more, or 4° or more. The guide angle of inclination is allowed to satisfy such a range, and thereby a silicon carbide ingot with reduced defects and an excellent crystal quality can be easily manufactured.

The guide unit 120 in the preparation operation (Sa) may comprise an amorphous carbon in the surface of a substance composing the surface and may comprise a graphite having a lower density than the density of reactor. Accordingly, an unnecessary reaction with a raw material can be inhibited when a silicon carbide ingot is grown.

The guide unit 120 in the preparation operation (Sa) may have a non-resistivity of 10 $\mu\Omega$m to 50 $\mu\Omega$m or less. Since the guide unit 120 may have such a non-resistivity, the shape of a manufactured silicon carbide ingot can be stably induced.

The guide unit 120 in the preparation operation (Sa) may have a truncated shape with opened upper and lower portions, and may protrude from, or may be attached to, the upper surface of the interior of the reactor 200, or may have a triangular shape that protrudes from, or is attached to, the silicon carbide seed crystal 110 from the inner diameter surface of the reactor. However, the shape is not limited thereto, and any shape that induces the circumference diameter of a silicon carbide ingot to be gradually increased when the silicon carbide ingot is grown to a perpendicular direction which is a direction of a raw material 300, can be applied.

The upper end of the guide unit 120 in the preparation operation (Sa) may be separate from the circumference surface of the silicon carbide seed crystal 110 with an interval of 5 mm to 20 mm. The upper end of the guide unit 120 may be a location which has the shortest distance with the circumference surface of the silicon carbide seed crystal. When an unnecessary single crystal is formed on the guide during growing processes of a silicon carbide ingot, interference added to the silicon carbide ingot can be minimized by allowing the guide unit 120 to be separate from a silicon carbide seed crystal with such a range.

The guide unit 120 in the preparation operation (Sa) may have a height of 30 mm or more, or 50 mm or less, based on a direction connecting one side of the silicon carbide seed crystal 110 and the silicon carbide raw material 300 in the shortest distance.

The reactor 200 in the preparation operation (Sa) may further comprise a heat insulating material 400 disposed in the external surface thereof and surrounding the reactor 200, at this time the heat insulating material may be in contact with the reactor 200, or may have a predetermined interval. In the reaction chamber 500, such as a quartz tube, the heat insulating material surrounding the reactor may be positioned. The temperature of internal space of the reactor 200 may be controlled by the heater 600 disposed in an external region of the heat insulating material and the reaction chamber 500.

The heat insulating material 400 in the preparation operation (Sa) may have an air porosity of, as examples, 72% to 95%, of 75% to 93%, or of 80% to 91%. When the heat insulating material satisfying the above air porosity is applied, crack generation of the grown silicon carbide ingot may be further reduced.

The heat insulating material 400 in the preparation operation (Sa) may have a compressive strength of 0.2 Mpa or more. The heat insulating material 400 may have a compressive strength of 0.48 Mpa or more, or 0.8 MPa or more. Additionally, the heat insulating material may have a compressive strength of 3 MPa or less, or 2.5 MPa or less. When the heat insulating material has such a compressive strength, it is excellent in thermal/mechanical stability, and the probability of occurrence of ash may be lowered, so that a silicon carbide ingot with better quality may be manufactured.

The heat insulating material 400 in the preparation operation (Sa) may comprise a carbon-based felt, may specifically comprise a graphite felt, and may comprise a rayon-based graphite felt, or a pitch-based graphite felt.

The reaction chamber 500 may comprise a vacuum exhauster 700 connected to an internal region of the reaction chamber 500 and configured to adjust the degree of vacuum inside the reaction chamber 500, a plumbing portion 810 connected to the interior of the reaction chamber 500 and introducing gas into the inside of the reaction chamber 500, and a mass flow controller 800 to control inflow of gas. Accordingly, the flow rate of the inert gas in a subsequent growth operation and a cooling operation may be controlled.

In the proceeding operation (Sb, S1), inert gas is injected into the internal space, and the raw material are sublimated by adjusting the temperature, pressure and atmosphere of the internal space, thereby inducing the growth of the silicon carbide ingot 100 from the silicon carbide seed crystal 110.

The proceeding operation (Sb, S1) may substantially change the internal space to have an inert gas atmosphere. The inert gas atmosphere may be formed by decompressing the internal space of the reactor 200 which has atmospheric atmosphere, thereby substantially inducing the atmosphere to a vacuum atmosphere, after the process of disposing the silicon carbide raw material 300 and seed crystals 110, and then injecting an inert gas. But it is not necessarily limited to this method.

The inert gas atmosphere in the proceeding operation (Sb, S1) refers to that the atmosphere of the internal space in the growth operation is not atmospheric atmosphere, and is based on an inert gas atmosphere, but the inert gas atmosphere also comprises an atmosphere in which a trace amount of gas is injected for the purpose of doping a silicon carbide ingot. An inert gas is applied to the inert gas atmosphere, and in an example, the inert gas may be argon, helium or a mixture thereof, but is not limited thereto.

The proceeding operation (Sb, S1) may proceed while heating the reactor 200 or the internal space of the reactor 200 by the heater 600, and simultaneously or individually with the heating, may proceed while decompressing the internal space to adjust the degree of vacuum and injecting an inert gas.

The proceeding operation (Sb, S1) comprises a process of sublimating the silicon carbide raw material 300 and a process of inducing a silicon carbide ingot 100 to grow on one surface of the silicon carbide seed crystal 110.

The heater 600 may be disposed around the reactor 200, and may be installed so as to be movable in the up-and-down direction substantially parallel to an arbitrary line from the silicon carbide seed crystal 110 to the raw material 300. The heater 600 may comprise a moving device or mover that changes a relative position in the up-and-down direction between the heater 600 and the reactor 200. Accordingly, the relative position between the reactor 200 and the heater 600 may be changed, and a temperature gradient in the internal space can be induced. In particular, the heater 600 may make a temperature difference between an upper portion of the internal space and a lower portion of the internal space.

The heater 600 may be an induction heater formed in a spiral coil along the outer peripheral surface of the reactor 200 or the outer peripheral surface of the heat insulating material 400 surrounding the reactor 200, but is not limited thereto.

The proceeding operation (Sb, S1) sequentially may comprise a pre-growth process (Sb) and a growth process (S1), wherein the pre-growth process may sequentially comprise a first process, a second process, and a third process, wherein the first process (Sb1) is a process that changes the high-vacuum atmosphere in the preparation operation to an inert atmosphere, the second process (Sb2) is a process of raising the temperature of the internal space using the heater 600, and the third process (Sb3) is a process of depressurizing the pressure of the internal space to reach the growth pressure with heating internal space to have the growth temperature.

The growth process (S1) is a process that maintains the internal space at the growth temperature and the growth pressure, and induces the ingot to grow.

The first process (Sb1) may be performed by injecting an inert gas such as argon. In this example, the pressure of the internal space may be 500 torr to 800 torr.

The second process (Sb2) is to heat the lower portion 240 of the internal space to have a starting temperature of 1500° C. to 1700° C. before growth. The temperature increase in the second process (Sb2) may proceed at a rate of 1° C./min to 10° C./min.

In the third process (Sb3), the temperature may be increased so that the temperature of the lower portion of the internal space becomes the growth temperature 2100° C. to 2500° C., and the growth pressure may be reduced to 1 torr to 50 torr. The temperature increase in the third process (Sb3) may proceed at a rate of 1° C./min to 5° C./min.

The second process and the third process may prevent the occurrence of polymorphism other than the target crystal in the above range of temperature increase rate and pressure. And the second process and the third process can induce stable growth of the ingot.

Figure 5:
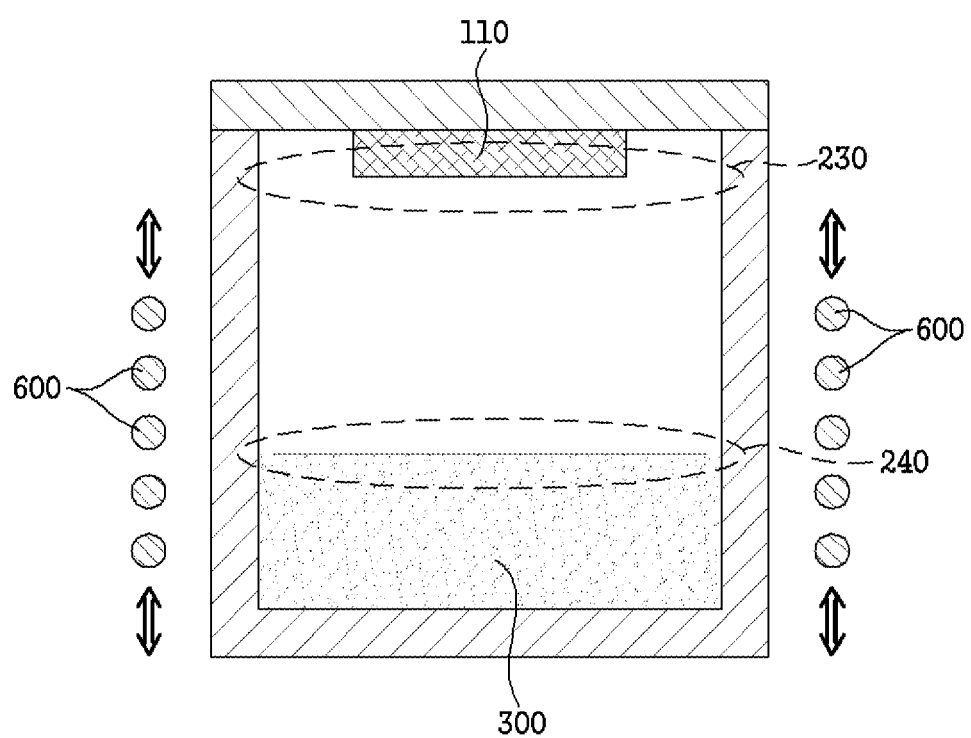
FIG. 5 is a conceptual view illustrating an example reactor of a system (manufacturing device) for manufacturing a silicon carbide ingot according to other embodiments, approximately.

Referring to FIG. 5, the upper portion 230 of the internal space is a partial space of the internal space close to the surface of the silicon carbide seed crystal 110 or the ingot, and the lower portion of the internal space 240 is a space of the internal space close to the surface of the raw material 300. Specifically, the upper portion 230 of the internal space may be a position located at a distance about 5 mm or more below the surface of the silicon carbide seed crystal 110 or the ingot, and may be a position having a height of 10 mm from the lowest end of the guide unit 120 to the upper end thereof. The lower portion 240 of the internal space may be a position located at a distance about 10 mm or more above the raw material 300. If the measured temperature is different for each measured position when the upper portion of the internal space and the lower portion of the internal space is the same position seen in a length direction of a crucible, the temperature measurement is based on the temperature of the center.

In the growth process (S1), the relative position of the heater 600 may be moved based on the reactor 200.

In the growth process (S1), the "maintaining the growth pressure" may include an example where the pressure of the injected gas is somewhat adjusted as needed within a range in which the growth of the silicon carbide ingot does not stop under reduced pressure. Additionally, the "maintaining the growth pressure" means that the pressure in the internal space is maintained within a predetermined range within a limit that maintains the growth of the silicon carbide ingot.

In the pre-growth process (Sb), a predetermined temperature difference may be generated between the temperature at the upper portion 230 of the internal space and the temperature at the lower portion of the internal space. The temperature difference at the starting temperature before growth may be 40° C. to 60° C., or 50° C. to 55° C. The temperature difference at the growth temperature may be 110° C. to 160° C., or 135° C. to 150° C. In view of this temperature difference, the pre-growth process may minimize the occurrence of polymorphism other than the target crystal, and can induce stable growth of the ingot.

The heating rate of the third process (Sb) may be less than the average heating rate of the total second process (Sb2) and third process (Sb3). The average heating rate of the total second process (Sb2) and third process (Sb3) is a value obtained by dividing the difference between the temperature at the start of the second process and the temperature at the end of the third process by the time taken, and the heating rate of the third process refers to the heating rate at each point in the third process.

The heater 600 may have a maximum heating region, and the maximum heating region refers to a portion that has the highest temperature in the atmosphere of the internal space heated by the heater 600. When the heater 600 surrounds the side surface of the reactor 200 in the form of a spiral coil, the internal space corresponding to the center of the heater 600 is the maximum heating region. In an example, when assuming a line (the vertical center line) in the vertical direction connecting the center of the seed crystal 110 and the silicon carbide raw material 300, and a surface (the central surface of heater 600) extended in the horizontal direction from the center of the height of the heater 600, the maximum heating region may be a region in which an intersection point between the vertical center line and the horizontal surface of the heater 600 is located.

The second process (Sb) and the third process (Sc) may be performed by locating the maximum heating region of the heater 600 to become the lower portion of the reactor 200 and the surface of the raw material 300, and when the heater 600 has a spiral coil shape, a temperature difference between the upper portion of the internal space and the lower portion of the internal space may be generated by changing the number of winding and thickness of heater 600.

The growth process (S1) is a process of sublimating the raw material to form a silicon carbide ingot, after the internal space is heated to the growth temperature in the third process (Sb3). In this example, the growth process may maintain the growth temperature of the internal space to form a silicon carbide ingot. Maintaining the growth temperature does not mean that it must be performed at a fixed proceeding temperature during the growth process, but means that a silicon carbide is grown in a temperature range where the growth of the silicon carbide ingot practically does not stop, even if there is a slight change in the absolute temperature.

The relative position of the heater 600 with respect to the reactor 200 in the growth process (S1) may become more distant at rate of 0.1 mm/hr to 0.48 mm/hr based on the seed crystal 110. Additionally, the relative position may become more distant at rate of 0.1 mm/hr to 0.4 mm/hr, or at rate of 0.2 mm/hr to 0.3 mm/hr based on the seed crystal 110. The speed range is quite low, and if the relative position is changed at this speed, the growth process can prevent the occurrence of polymorphic crystals other than the target crystal and can grow a silicon carbide ingot with reduced defects.

In the growth process (S1), the change of the relative position of the heater 600 with respect to the reactor 200 and the seed crystal 110 may be performed after reaching the growth temperature, and may be performed after 1 hour to 10 hours after reaching the growth temperature.

In the growth process (S1), the upper portion 230 of the internal space may have a sub-heating region of which the temperature is 110° C. to 160° C. lower than the temperature of the maximum heating region in the reactor 200. Additionally, the temperature of the sub-heating region may be 135° C. to 150° C. lower than the temperature of the maximum heating region.

The sub-heating region refers to a region having a relatively low temperature in the atmosphere of the internal space heated by the heater 600. When the heater 600 surrounds the side surface of the reactor 200 in the form of a spiral coil, the sub-heating region may be located above the maximum heating region.

When assuming a line in the vertical direction connecting (the vertical center line) the center of the seed crystal 110 and the silicon carbide raw material 300, and a surface (the central surface of heater 600) extended in the horizontal direction from the center of the height of the heater 600, the sub-heating region may be located between the maximum heating region and the silicon carbide seed crystal 110 or ingot surface. Also, preferably, at least some of the sub-heating region may overlap the upper portion of the internal space.

The heater 600 can be moved up-and-down direction based on the reactor 200 through a moving device that changes a relative position between the heater 600 and the reactor 200 to the up-and-down direction. That is, it is possible to move the heater 600 in a substantially parallel direction based on an arbitrary line from the seed crystal 110 disposed in the reactor 200 toward the silicon carbide raw material 300.

The heater 600 in the growth process (S1) may be moved while descending relative to the reactor 200 at the above speed.

In an example, the growth temperature in the growth process (S1) may be 2100° C. to 2500° C., or 2200° C. to 2400° C. based on the maximum heating region. Additionally, the growth temperature in the growth process (S1) may be 1900° C. to 2300° C. or 2100° C. to 2250° C. based on the upper portion 230 of the internal space.

During the growth process (S1), the total moving distance of the heater 600 may be 10 mm or more, or 15 mm or more. Additionally, during the growth process (S1), the total moving distance of the heater 600 may be 45 mm or less, or 30 mm or less.

The growth process may proceed for 5 hours to 200 hours. Additionally, the growth process may be proceeded for 75 hours to 100 hours.

The pre-growth process (Sb) and/or the growth process (S1) may be performed while the reactor 200 rotates on the vertical direction, and through this, a temperature gradient that is more favorable for growth of a silicon carbide ingot may be induced to be formed.

In the proceeding operation (Sb, S1), an inert gas of a predetermined flow rate may be added to the exterior of the reactor 200. The inert gas may form a flow of gas in the internal space of the reactor 200 and may induce a flow of gas from the raw material 300 toward the silicon carbide seed crystal 110. Accordingly, a stable temperature gradient of the reactor 200 and the internal space can be formed.

The cooling operation (S2) is an operation of cooling the silicon carbide ingot grown through the proceeding operation under conditions of a predetermined cooling rate and flow rate of an inert gas.

In the cooling operation (S2), cooling may be proceeded at a rate of 1° C. to 10° C. Also, cooling may proceed at a rate of 1° C. to 5° C.

In the cooling operation (S2), pressure control of the internal space of the reactor 200 may proceed simultaneously or separately. The pressure may be controlled to have a pressure in the internal space of 800 torr at maximum.

In the cooling operation (S2), like the proceeding operation, an inert gas of a predetermined flow rate may be added to the inside of the reactor 200. The inert gas may form a flow of gas in the internal space of the reactor 200. Additionally, the inert gas may form a flow of gas from the raw material 300 toward the silicon carbide seed crystal 110.

The cooling operation may comprise a first cooling process and a second cooling process. The first cooling process is a process of pressurizing the pressure of the internal space of the reactor 200 to be at least atmospheric pressure, and cooling the temperature of the internal space to be 1500° C. to 1700° C. based on the upper portion 230 of the internal space, and the second cooling process is a process of cooling the temperature of the internal space to room temperature after the first cooling operation.

The recovery in the cooling operation may be achieved by cutting the rear of the silicon carbide ingot in contact with the seed crystal 110. The silicon carbide ingot cut in this way shows a favorable height difference between the center of the grown end and the edge, and can have a reduced defect density. The specific shape and defect density of the silicon carbide ingot will be described below.

Silicon Carbide Wafer Manufacturing Method

In one general aspect, a silicon carbide wafer manufacturing method, in accordance with one or more embodiments, may comprise a cutting operation of cutting a silicon carbide ingot manufactured according to the above to prepare a silicon carbide wafer; and may polish the edge of the silicon carbide ingot before the cutting operation and thereby the silicon carbide ingot may have a cylinder shape processed to have regular diameter.

The cutting operation may cut the silicon carbide ingot at regular thickness intervals, and a predetermined off angle from the (0001) surface of the silicon carbide ingot or a surface where growth is started. The off angle may be 0° to 10°.

The cutting operation may cut the silicon carbide wafer to have a thickness of 150 μm to 900 μm, or 200 μm to 600 μm, but is limited thereto.

The silicon carbide wafer manufacturing method may comprise a processing operation of flattening the thickness of a silicon carbide wafer prepared through the cutting operation and polishing the surface thereof.

The processing operation may apply wheel grinding and the like to both surfaces of a silicon carbide wafer, and in this time the polishing material used in wheel grinding may be a diamond polishing material. Through the process of flattening the thickness in the processing operation, damage and stress added to a wafer in the cutting operation can be reduced and the thickness can be flattened.

The process of polishing the surface of the processing operation may further comprise a wet or dry etching operation.

The processing operation may further comprise a chemical mechanical polishing operation. The chemical mechanical polishing may be performed by adding polishing particle slurry to a polishing pad placed on a plane and contacting a silicon carbide wafer to the polishing pad in a predetermined pressure with rotating the polishing pad and the silicon carbide wafer.

The silicon carbide wafer manufactured through the manufacturing method has excellent advantages of a reduced defect density, a bending characteristic, and a bow absolute value of 50 μm or less.

Silicon Carbide Ingot Manufacturing Method

In a general aspect, a silicon carbide ingot manufacturing method, in accordance with one or more embodiments, includes a preparation operation of disposing a raw material 300 and a silicon carbide seed crystal 110 to be separate in a reactor 200 having an internal space; a growth operation of sublimating the raw material by adjusting the temperature, the pressure, and the atmosphere of the internal space and preparing a silicon carbide ingot 100 grown from the silicon carbide seed crystal 110; a cooling operation of cooling the reactor 200 and retrieving the silicon carbide ingot; a heat insulating material 400 surrounding the external surface of the reactor 200, and a heating unit 600 for adjusting the temperature of the internal space.

The heat insulating material may comprise a heat insulating material circumference part 410 surrounding the external surface of the reactor 200.

The volume of the reactor Vc and the volume of the heat insulating material circumference part Vi may have a ratio Vc/Vi of 0.05 to 0.8.

The growth operation may include a heating process that increases the temperature of the internal space from room temperature to a first temperature, a first growing process that heats the internal space from a first temperature to a second temperature, and a second growing process that maintains the second temperature, to prepare a silicon carbide ingot.

The first temperature may be a temperature to start depressurizing of the internal space.

The second temperature may be a temperature that induces growth of a silicon carbide ingot at the depressurized pressure after the depressurization of the internal space is completed.

A temperature difference may be a difference between an upper temperature and a lower temperature in the internal space.

The temperature difference in the second temperature may be 160° C. to 240° C.

The preparation operation may dispose a raw material and a silicon carbide seed crystal 110 to be separated and face each other in a reactor 200 having an internal space.

The silicon carbide seed crystal 110 may be a proper size depending on a desired wafer, and the C surface ((000-1) surface) of the silicon carbide seed crystal 110 may face the direction of a raw material 300.

The silicon carbide seed crystal 110 may comprise a 4H silicon carbide in four inches or more, in six inches or more, or in eight inches or more. The silicon carbide seed crystal 110 may be twelve inches or less.

The raw material 300 may be a powder shape having a carbon source and a silicon source, and raw material in which the powder is necking treated or a silicon carbide powder whose surface is carbonated may be applied.

In an example, the reactor 200 may be any container that grows a reaction of a silicon carbide ingot, and specifically a graphite crucible may be applied.

Figure 4:
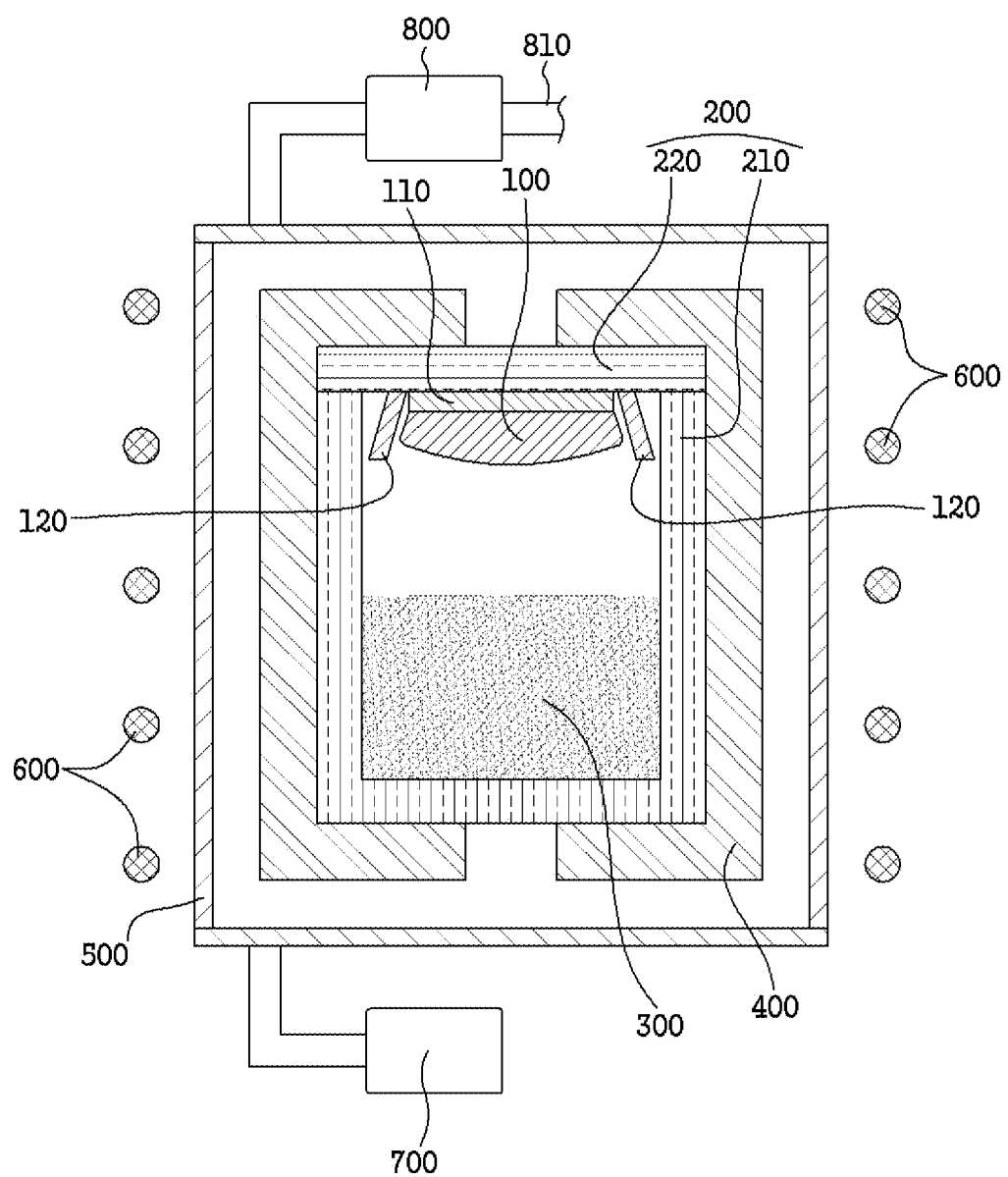
FIG. 4 is a conceptual view illustrating an example reactor of a system (manufacturing device) for manufacturing a silicon carbide ingot, in accordance with one or more embodiments.

Referring to FIG. 4, in an example, the reactor 200 may comprise a body 210 comprising an internal space an opening, and a cover 220 corresponding to the opening. The enclosure of the body 210 and the cover 220 may form the internal space. The crucible cover 220 may further comprise a seed crystal holder as one body or a separate body with the crucible cover 220, may fix a silicon carbide seed crystal 110 through the seed crystal holder, and thereby may allow a silicon carbide seed crystal 110 and a raw material to face each other.

The reactor 200 may be fixed by being surrounded by a heat insulating material 400, and the heat insulating material 400 surrounding the reactor 200 may be located inside a reacting chamber 500 such as a quartz tube. A heater 600 may be equipped in the external of the heat insulating material 400 and the reacting chamber 500 to control the temperature of the internal space of the reactor 200.

The heat insulating material 400 may have a non-resistivity of $8 \times 10^{-3}$ Ωm or less, $5 \times 10^{-3}$ Ωm or less, or $3.1 \times 10^{-3}$ Ωm. The heat insulating material 400 may have a non-resistivity of $1 \times 10^{-4}$ Ωm or more, $2.5 \times 10^{-4}$ Ωm or more, or $1.0 \times 10^{-4}$ Ωm or more. When a heat insulating material 400 having such a non-resistivity is applied, defect occurrence of a growing silicon carbide ingot may be more reduced.

Figure 9:
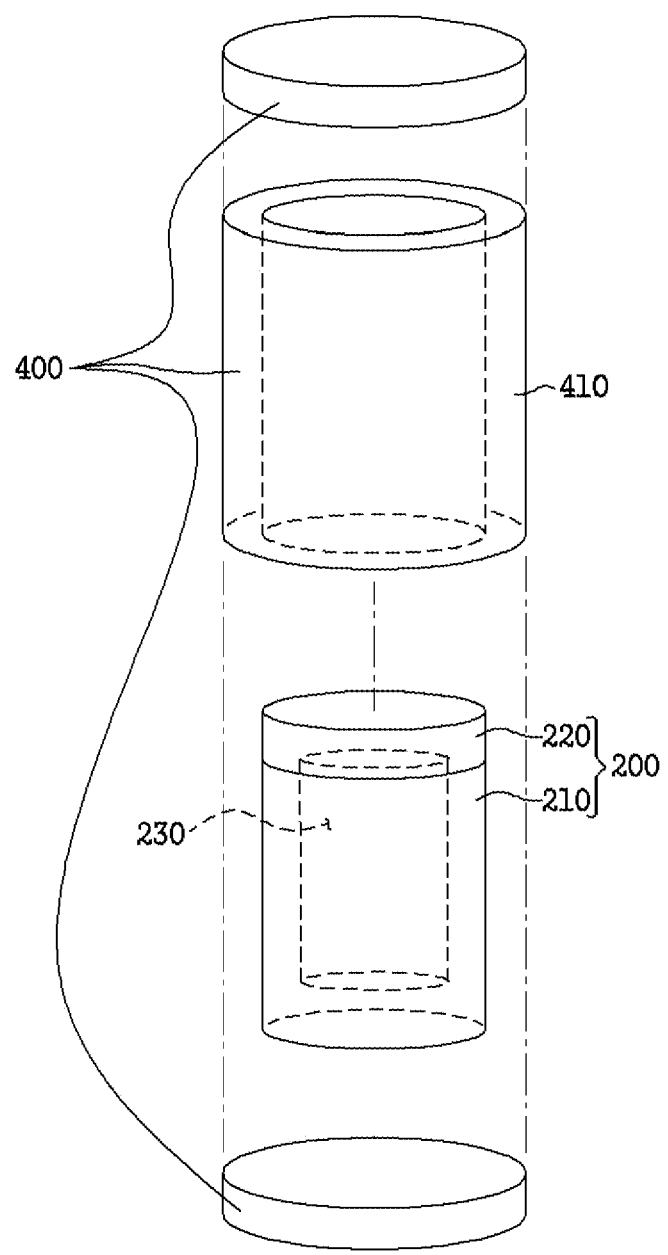
FIG. 9 is a disassembled perspective view illustrating one example of a reactor, a cover, a heat insulating material, and a heat insulating material circumference part of a manufacturing device for a silicon carbide ingot, in accordance with one or more embodiments.

Referring to FIG. 9, the heat insulating material 400 may comprise a heat insulating material circumference part 410 surrounding the side of the reactor 200, and the thickness of the heat insulating material circumference part may be 200 mm to 600 mm, or 300 mm to 500 mm, as only examples. When a heat insulating material 400 having such a thickness of the circumference part is applied, a silicon carbide ingot in a high quality may be grown.

The het insulating material 400 may have a porosity of 72% to 95%, 75% to 93%, or 80% to 91%. When a heat insulating material 400 satisfies the above porosity, defect occurrence of a growing silicon carbide ingot may be further reduced.

The heat insulating material 400 may comprise a carbon-based felt, and specifically, may comprise a graphite felt, and even more specifically, may comprise rayon-based graphite felt, or a pith-based graphite felt.

The density of the heat insulating material 400 may be 0.14 g/cc to 0.28 g/cc, or 0.15 g/cc to 0.17 g/cc. When a heat insulating material having such a density is applied, a silicon carbide ingot in a high quality can be grown.

The ratio Vc/Vi of a volume of the reactor 200 Vc and the volume of a heat insulating material circumference part 410 Vi may be 0.05 to 0.8, 0.1 to 0.7, or 0.3 to 0.5, as only examples.

Figure 7:
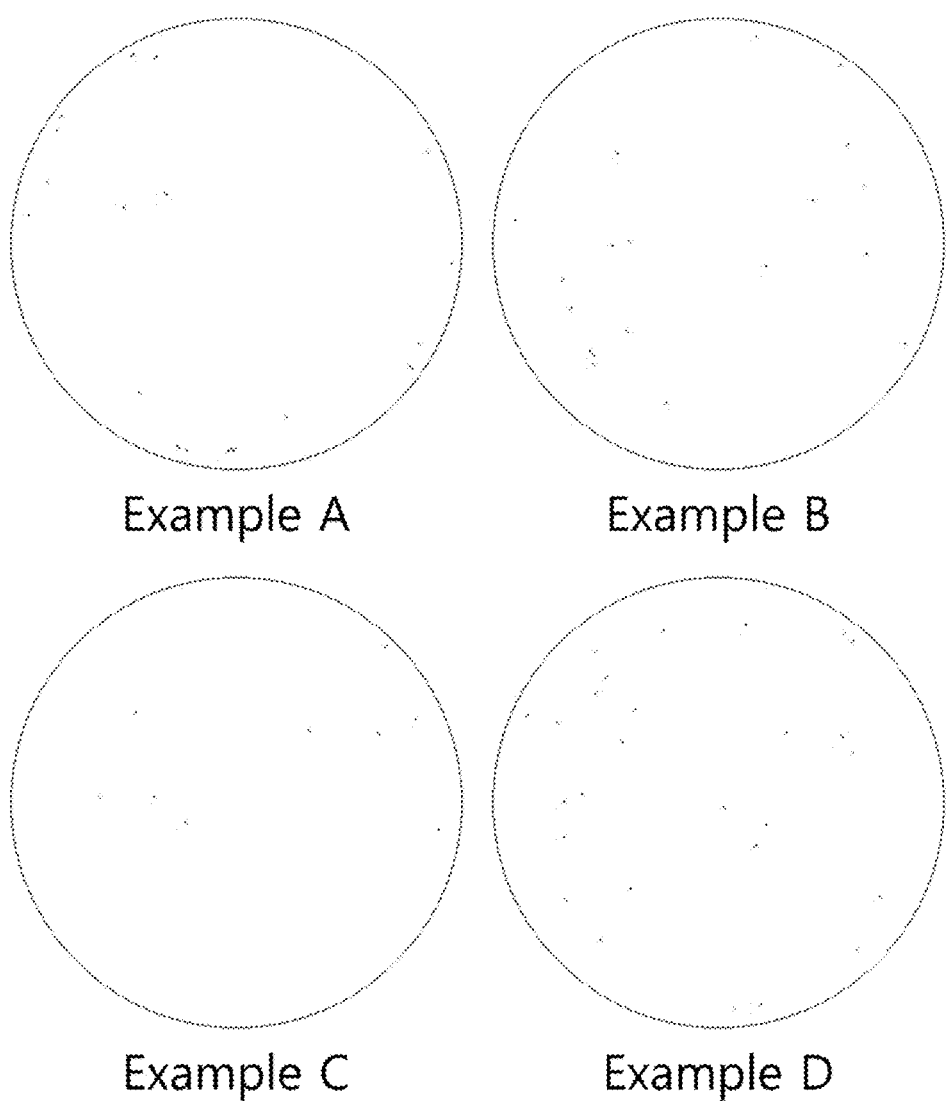
FIG. 7 is an image map illustrating micropipe defects in one side of a silicon carbide wafer of Examples A to D.
Figure 10:
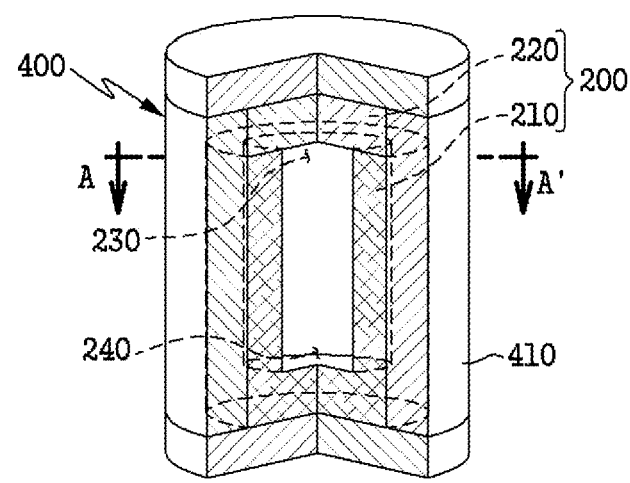
FIG. 10 is a perspective view illustrating another example of a silicon carbide ingot manufacturing device, in accordance with one or more embodiments.
Figure 11:
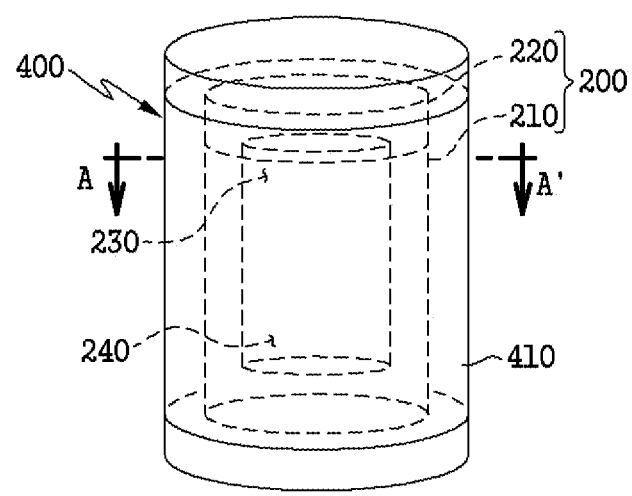
FIG. 11 is a perspective view illustrating another example of a silicon carbide ingot manufacturing device, in accordance with one or more embodiments.
Figure 12:
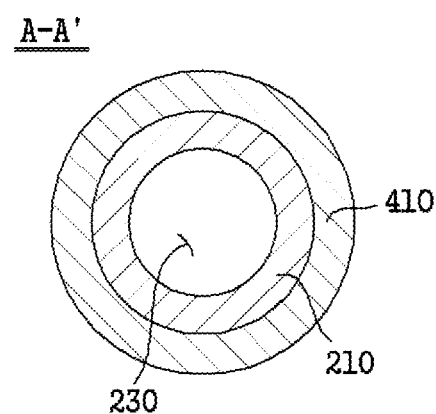
FIG. 12 is a conceptual view illustrating sections of an example reactor and a heat insulating circumference part when observed at a plane including AA'.

Referring to FIG. 7, the volume of the reactor Vc may be a volume of a reactor 200 itself except for the internal space. The heat insulating material circumference part 410 may surround the side except for upper and lower covers of the reactor 200 as illustrated in FIGS. 9 to 11, or may surround the internal space. Similar to FIG. 4, in FIGS. 9-11 a seed crystal 110 may be disposed in an upper portion of the internal space, and a raw material 300 may be disposed in a lower portion 240 of the internal space.

The volume of the reactor 200 Vc and the volume of the heat insulating material circumference part 410 Vi may be actually measured or may be calculated by a three-dimension modeling program (ex. CATIA, SolidWorks, and AutoCAD).

The heat insulating material circumference part 410 may be a hollow type having an inner and an outer diameter. The outer diameter of the heat insulating material circumference part 410 may be eight inches or more, or fourteen inches or less, as only examples.

The heat insulating material 400 may further comprise a heat insulating material upper lead which is disposed in an upper portion of the reactor 200, and a heat insulating material lower lead, which is disposed in a lower portion of the reactor 200. The heat insulating material upper lead and the heat insulating material lower lead may respectively cover upper and lower portions of the heat insulating material circumference part 410 to be closed and may treat the internal of the heat insulating material to be heat insulated.

Since the reactor 200 and the heat insulating material circumference part 410 may have a suitable volume ratio, defect occurrence of a growing silicon carbide ingot may be minimized, and the occurrence of a micropipe or the like may be minimized when a wafer is manufactured through a silicon carbide ingot. When being out from such a Vc/Vi ratio, a growing silicon carbide ingot may have an excessive curvature, and accordingly the quality may be degraded due to the increase of residual stress with increasing the possibility of crack occurrence.

The reacting chamber 500 may comprise a vacuum degassing device 700 connected to the internal of the reacting chamber, and that adjusts vacuum degree inside the reactor 200, a pipe 810 connected to the internal of the reacting chamber that induces gas to flow into the interior of the reacting chamber, and a mass flow controller 800, that controls flow of gas. By implementing these elements, quantity of flow of inert gas may be adjusted in subsequent growth operations and cooling operations.

The growth operation may be performed by heating the reactor 200 and the internal space of the reactor 200 by the heater 600, may depressurize the internal space at the same time with the heating operation or as a separate process to adjust the vacuum degree, and may induce growth of a silicon carbide ingot by injecting internal gas.

The heater 600 may be equipped to be movable in an up-and-down direction of the reactor 200, accordingly relative positions of the reactor 200 and the heater 600 may be changed based on this movement, and an upper portion of the internal space 230 and a lower portion of the internal space 240 may have a temperature difference based on the heater 600. Specifically, the heater 600 may add a temperature difference to a silicon carbide seed crystal 110 of an upper portion and a raw material 300 of a lower portion in the internal space.

In an example, the heater 600 may be formed as a spiral coil along to a circumference surface of the reactor 200 or a heating material 400 surrounding a reactor 200.

Figure 2:
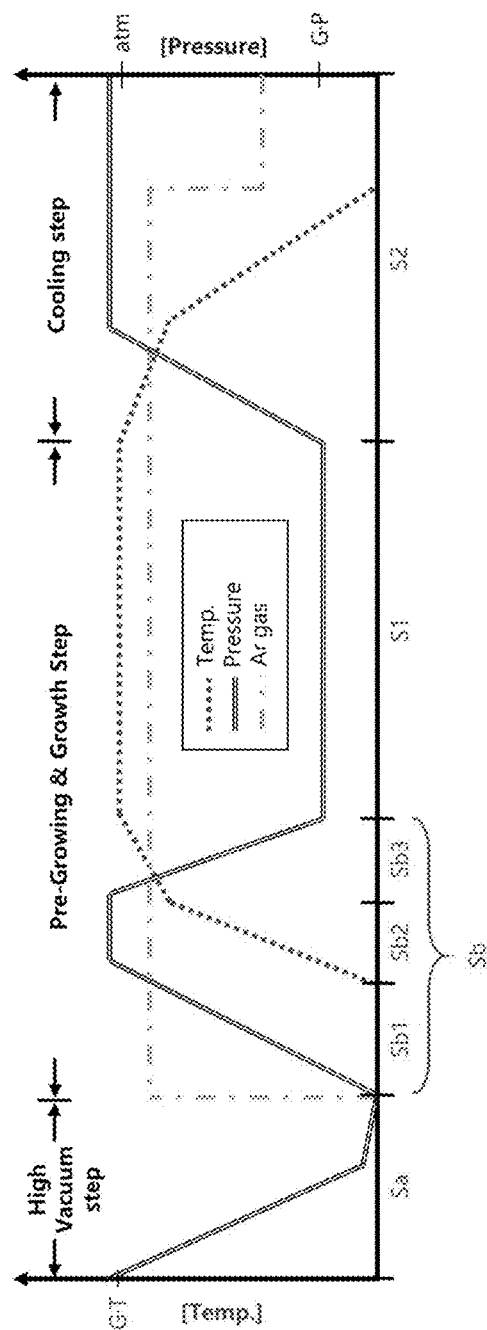
FIG. 2 is a graph illustrating a change of a temperature, a pressure, and an inert gas (Ar) depending on a time flow, in accordance with one or more embodiments.

Referring to FIG. 2, the growth operation may comprise a heating process (Sb1 or Sb2) that increases the temperature of the internal space from room temperature to a first temperature; a first growing process (Sb3) that heats the internal space from a first temperature to a second temperature; and a second growing process (S1) that maintains the second temperature, and thereby may prepare a silicon carbide ingot.

Before the growth operation, a depressurizing process (Sa) that depressurizing the internal space in a state of the atmosphere may be implemented.

The heating to the first temperature may proceed at a rate of 3° C./min to 13° C./min, or 5° C./min to 11° C./min. The heating to the starting temperature for pre-growth may proceed at a rate of 7° C./min to 10° C./min.

The depressurizing process Sa may be performed to have a pressure of the internal space of 10 torr or less, or 5 torr or less, as examples.

The heating process (Sb1 or Sb2) may be performed to have a pressure of the internal space of 500 torr to 800 torr by injecting an inert gas such as argon or nitrogen, and the heating may be made to a lower portion of the internal space to have a temperature of 1500° C. to 1700° C. at a rate of 1° C./min to 10° C./min.

Referring to FIG. 5, an upper portion of the internal space 230 in the growth operation may be a position corresponding to a surface of a silicon carbide seed crystal 110, and a lower portion of the internal space 2410 may be a position corresponding to a surface of a raw material 300.

The first temperature refers to a temperature when sublimating of the raw material 300 is partially started, and may be a temperature after the heating process (Sb1 or Sb2) before the growth operation as indicated in a dotted line region of FIG. 2, or may be a temperature implemented when depressurizing of the internal space is started after injection of an inert gas in the heating process. Specifically, it may be 1500° C. to 1700° C., or 1600° C. to 1640° C. based on a lower portion of the internal space 240.

The first temperature may be 1450° C. to 1650° C. or 1550° C. to 1587° C. based on an upper portion of the internal space 230.

The first growing process (Sb3) may have a temperature difference between an upper portion of the internal space 230 and a lower portion of the internal space 240 of 40° C. to 60° C., or 50° C. to 55° C. at the first temperature.

The second temperature refers to a temperature when sublimating of the raw material 300 is started in earnest, and may be a temperature after heating of the first growing process is made as indicated in a dotted line region of FIG. 2, or may be a temperature that induces the growth of a silicon carbide ingot under the depressurized pressure after depressurizing of the internal space is completed. Additionally, the pressure may be changed within ±10% compared to the depressurized pressure to induce the growth of a silicon carbide ingot at the second temperature.

The second temperature may be 2100° C. to 2500° C., or 2200° C. to 2400° C. based on a lower portion of the internal space 240.

The second temperature may be 1900° C. to 2300° C., or 2100° C. to 2250° C. based on an upper portion of the internal space 230.

The first growing process (Sb3) may have a temperature difference between an upper portion of the internal space 230 and a lower portion of the internal space 240 of 160° C. to 240° C., or 180° C. to 220° C. at the second temperature. The temperature difference may be 196° C. to 207° C., or 202° C. to 207° C.

The first growing operation (Sb3) may increase a temperature difference between an upper portion of the internal space 230 and a lower portion of the internal space 240 together depending on the temperature increase of the internal space.

The first growing process (Sb3) has a temperature range, a temperature difference, and a temperature difference variation of an upper portion of the internal space 230 and a lower portion of the internal space 240, and thereby may minimize the occurrence of polymorphism except a desired crystal when an initial silicon carbide ingot is formed with enabling stable ingot growth. If the first temperature and the second temperature of the first growing process have a temperature difference which is less than the above range, the possibility of forming a polycrystal is increased due to being mixed of other crystals except a desired crystal, with generating a possibility of lowering growth speed, and if the temperature difference is more than the above range, the crystal quality may be degraded.

The first growing process (Sb3) may perform depressurizing from 1 torr to 50 torr with heating from the first temperature to the second temperature.

The heating speed of the first growing process (Sb3) may be smaller than the heating speed of the heating process (Sb1 or Sb2), and may be smaller than the average heating speed of all the heating process and the first growing process.

The heating speed of the first growing process (Sb3) may be 1° C./min to 5° C./min, or 3° C./min to 5° C./min. The above temperature range may prevent the occurrence of polymorphism except a desired crystal and induce stable growth.

The first growing process (Sb3) may be performed to have a lower portion of the internal space 240 and the surface 240 of the raw material as the maximum heating region of the heater 600, and when the heater 600 is a spiral coil shape, it may add a desired temperature difference between an upper portion of the internal space 230 and a lower portion of the internal space 240 by changing a number of winding or a thickness.

The second growing process (S1) maintains a second temperature after heating to the second temperature in the first growing process (Sb3), and thereby sublimates a raw material 300 in earnest to prepare a silicon carbide ingot.

The second growing process (S1) may proceed for 5 hours to 180 hours, 30 hours to 160 hours, or 50 hours to 150 hours, but is not limited thereto.

The growth process may be performed by being rotated on an axis of an up-and-down direction of the reactor 200, and may maintain a temperature gradient to be the same.

The growth operation may add an inert gas in a predetermined quantity of flow to the exterior of the reactor 200. The inert gas may flow in the internal space of the reactor 200, and the flow may be made from the raw material 300 to the silicon carbide seed crystal 110. Accordingly, a stable temperature gradient of the reactor 200 and the internal space may be formed.

The inert gas of the second growing operation (S1) may be as examples, argon, helium, or a mixture thereof.

After the second growing operation (S1), a cooling operation (S2) of cooling the reactor 200, and a retrieving operation of retrieving the silicon carbide ingot may be performed.

The cooling operation (S2) cools the silicon carbide ingot gown through the growth operation under the condition of a predetermined cooling speed and a predetermined quantity of flow of an inert gas.

The cooling operation (S2) may perform cooling at a rate of 1° C./min to 10° C./min, or 3° C./min to 9° C./min, but is not limited thereto. The cooling operation may perform cooling at a rate of 5° C./min to 8° C./min, but is not limited thereto.

The cooling operation (S2) may perform pressure adjustment of the internal space of the reactor 200 at the same time, or alternately, the pressure adjustment may be performed as a separate process from the cooling operation. The pressure adjustment may be made to the internal space to have a pressure of 800 torr as the maximum.

The cooling operation (S2) may add a predetermined quantity of flow of an inert gas to the interior of the reactor 200 as the same as the growth operation. The inert gas may be for example, argon or nitrogen. The inert gas may flow in the internal space of the reactor 200, and the flow may be made from the raw material 300 to the silicon carbide seed crystal 110.

The cooling operation (S2) may comprise a first cooling process of pressurizing the internal space of the reactor 200 to have a pressure equal to or greater than atmospheric pressure, and cooling the internal space to have a temperature of 1500° C. to 1700° C. based on an upper portion 230, and a second cooling process of cooling the internal space to have room temperature after the first cooling operation.

The cooling operation (S2) may perform an operation of retrieving the silicon carbide ingot 100 by cutting the rear of a silicon carbide ingot 100 in contact with the silicon carbide seed crystal 110. A silicon carbide ingot 100 cut in this manner may minimize loss of the rear region in contact with a seed crystal, and show an improved crystal quality.

First Silicon Carbide Ingot Manufacturing System I

In a general aspect, a silicon carbide ingot manufacturing system (manufacturing device), comprises a reactor 200 which has an internal space; a heat insulating material 400 disposed on the external surface of the reactor 200 and surrounding the reactor 200; and a heater 600 that adjusts the temperature of the reactor 200 or the internal space.

A silicon carbide seed crystal 110 may be located at an upper portion of the internal space.

A raw material 300 may be located at a lower portion of the internal space.

A moving device or mover that changes relative positions of the heater 600 and the reactor 200 in an up-and-down direction may be provided.

The internal space comprises a guide 120 equipped in the external of the silicon carbide seed crystal 110.

The guide may extend in a perpendicular direction from the silicon carbide seed crystal 110 to a silicon carbide raw material, but may have an inner diameter surface tilted to the external side by 50° or less based on the perpendicular direction.

A silicon carbide ingot may be grown from the seed crystal, and

The moving of the heater 600 may have a relative position that becomes more distant at a rate of 0.1 mm/hr to 0.48 mm/hr based on the seed crystal.

Figure 3:
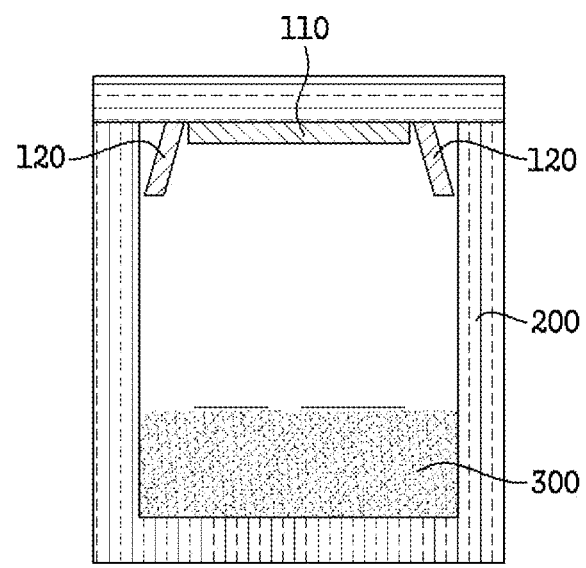
FIG. 3 is a conceptual view illustrating a system (manufacturing device) for manufacturing a silicon carbide ingot, in accordance with one or more embodiments.

Referring to FIGS. 3 and 4, the reactor 200 may comprise a body 210 comprising an internal space and an opening, and a cover 220 corresponding to the opening and sealing the internal space. Other descriptions are the same as disclosed above.

The detailed elements of the guide unit 120 are the same as described above.

The material and physical properties of the insulating material 400 are the same as described above.

Referring to FIG. 4, the silicon carbide ingot manufacturing system may comprise a reaction chamber 500 in which a reactor 200 surrounded by the insulating material 400 is placed therein. In this example, the heater 600 may be provided outside the reaction chamber 500 to control the temperature of the internal space of the reactor 200.

The reaction chamber 500 may comprise a vacuum exhauster 700, a pipe 810 and a mass flow controller 800. The vacuum exhauster 700 is a device connected to the interior of the reaction chamber 500, and controls the degree of vacuum inside the reaction chamber 500. The pipe 810 is a device connected to the interior of the reaction chamber 500, and introduces gas into the reaction chamber 500. The mass flow controller 800 is a device that controls the gas inflow. By utilizing these elements, it is possible to control the flow rate of the inert gas in the growth operation and the cooling operation.

Referring to FIGS. 1 and 5, the relative position of the heater 600 with respect to the reactor 200 may become more distant at a rate of 0.1 mm/hr to 0.48 mm/hr, may be distant at a rate of 0.1 mm/hr to 0.4 mm/hr, or may be distant at rate of 0.2 mm/hr to 0.3 mm/hr based on the seed crystal. By satisfying the above moving speed, a stable temperature difference and temperature gradient may be applied, even if an ingot grows and the position of the surface changes, and formation of polymorphic crystals other than the target crystal is prevented.

The movement of the heater 600 may proceed in the proceeding operation of sublimating the raw material by controlling the temperature, pressure and atmosphere of the internal space, and preparing a silicon carbide ingot grown from the seed crystal. In an example, the movement of the heater 600 may proceed in the second process and the third process, specifically the pre-growth process of the proceeding operation, and the growth process. These operations and processes are the same as described above.

The systems may comprise a moving device or mover that changes the relative position of the heater 600 based on the reactor 200 to an up-and-down direction, and in the growth operation, the heater 600 may descend and move at the above speed as shown in FIGS. 1 and 5.

The heater 600 may allow the maximum heating region to be located at a lower portion of the internal space. The maximum heating region is a region of the internal space at a position corresponding to the center of the heater 600. When the heater 600 has a spiral coil shape, the internal region of the heater 600 having a predetermined length toward both ends from the center of the heater 600, based on an arbitrary line connecting the silicon carbide raw material and the seed crystal 110 may be the maximum heating region. The temperature of the maximum heating region may be 2100° C. to 2500° C., or 2200° C. to 2400° C.

The heater 600 may be moved so that the temperature of the upper portion of the internal space is 110° C. to 160° C. lower than, or 135° C. to 150° C. lower than the temperature of the maximum heating region in the growth process. When the heater 600 has a spiral coil shape, the upper portion of the internal space may be located above the center which is the maximum heating region. The temperature of the upper portion of the internal space may be 1900° C. to 2300° C., or 2100° C. to 2250° C.

The silicon carbide ingot manufacturing system may sequentially proceed in the preparation operation (Sa), the proceeding operation (Sb, S1), and the cooling operation (S2) described above.

Second Silicon Carbide Ingot Manufacturing System

A silicon carbide ingot manufacturing system (manufacturing device), in accordance with one or more embodiments, may comprise, a reactor 200 having an internal space; a heat insulating material 400 surrounding the external surface of the reactor 200; a heater 600, that adjusts the temperature of the internal space to manufacture a silicon carbide ingot, The internal space may comprise a silicon carbide seed crystal 110 at an upper portion 230.

The internal space may comprise a raw material at a lower portion 240.

The heater may be equipped to be movable in an up-and-down direction of the reactor 200 to adjust a temperature difference between an upper portion of the internal space and a lower portion of the internal space.

The volume of the reactor Vc and the volume of the heat insulating material circumference part 410 Vi may have a ratio Vc/Vi of 0.05 to 0.8.

The depressurizing operation (Sa), the heating operation (Sb1 or Sb2), the first growing operation (Sb3), the second growing operation (S1) and the cooling operation (S2) of the manufacturing method for a silicon carbide ingot described above may be applied through the silicon carbide ingot manufacturing system.

The silicon carbide seed crystal 110, the raw material 300, the reactor 200, the heat insulating material 400, the heater 600, of the silicon carbide ingot manufacturing system may be the same as described in the First Silicon Carbide Ingot Manufacturing Method.

Silicon Carbide Wafer Manufacturing Method

In a general aspect, a silicon carbide wafer manufacturing method, in accordance with one or more embodiments, comprises, a cutting operation of cutting a silicon carbide ingot manufactured through the manufacturing method of a silicon carbide ingot to prepare a silicon carbide wafer.

The cutting operation may cut the silicon carbide wafer to have a thickness of 150 μm to 900 μm, or 200 μm to 600 μm, but is not be limited thereto.

After the cutting operation, the silicon carbide wafer manufacturing method may further comprise a processing operation of flattening the thickness of a prepared silicon carbide wafer, and polishing the surface thereof.

In the processing operation a grind wheel may be a shape having particles embedded in the surface, and the particles embedded in the surface of the grinding wheel may be diamond.

The processing operation may be performed while the grinding wheel and a wafer rotate in opposite directions from each other.

The processing operation may have a grinding wheel whose diameter is larger than the diameter of the wafer, and the diameter of grinding wheel may be 250 mm or less, as only examples.

After the processing operation, the silicon carbide wafer manufacturing method may further comprise an operation of performing dry etching to the silicon carbide wafer.

The processing operation may further comprise a chemical mechanical polishing operation.

The chemical mechanical polishing operation may be implemented by contacting a fixed wafer to a rotating polishing head in a predetermined pressure while adding polishing particle slurry on a rotating plane.

After the processing operation, a washing operation implemented through a general RCA (Radio Corporation of America) chemical washing solution, as an example, may be further made.

A wafer manufactured through the manufacturing method has advantages of a low defect density, a reduced number of impurity particles, and a good surface characteristic, and when applying this to the manufacture of elements, it is possible to manufacture an element excellent in electrical and optical properties.

Silicon Carbide Wafer Manufacturing System

In a general aspect, a system (manufacturing device) for silicon carbide wafer manufacturing system (manufacturing device), in accordance with one or more embodiments, may comprise a silicon carbide ingot manufacturing system, and a cutting device that cuts a manufactured silicon carbide ingot to prepare a silicon carbide wafer.

The cutting device may be a device which cuts a silicon carbide ingot into a silicon carbide wafer shape which has a regular thickness. In an example, a wire saw comprising diamond particles may be implemented as the cutting device.

The cutting device may perform a cutting operation to have a predetermined off angle with (0001) surface of the silicon carbide ingot, and the off angle may be 0° to 10°.

The silicon carbide wafer manufacturing system may further comprise a grinding device that polishes the thickness of a cut silicon carbide wafer and polishing the surface, an etching device that performs dry or wet etching to the surface of a silicon carbide wafer, a chemical mechanical polishing device, and the like.

A silicon carbide wafer manufactured through the system for manufacturing the has excellent advantages of a reduced defect density, a bending characteristic, a bow absolute value of 50 μm or less.

Silicon Carbide Wafer 10

In a general aspect, a silicon carbide wafer 10 in accordance with one or more embodiments, may include a micropipe density of 1/cm$^2$ or less, and a full width at half maximum of 0.01° to 0.5° according to High Resolution X-ray Diffraction (HRXRD) analysis.

The silicon carbide wafer 10 may have a full width at half maximum of the rocking curve of 0.01° to 0.5°, 0.02° to 0.4°, or 0.1° to 0.4°. A silicon carbide wafer having such a characteristic may have an excellent crystalline structure characteristic and may improve the characteristic of an element manufactured through subsequent processes.

The rocking curve was measured by applying High Resolution X-ray Diffraction system (HR-XRD system) as follows: fitting [11-20] direction of the silicon carbide wafer to an X-ray route, setting an angle of an X-ray source and an X-ray detector to be 2θ (35° to 36°), and after that adjusting an omega (ω or θ of an X-ray detector) angle to be fitted to an off angle of a silicon carbide wafer to measure a rocking curve. The crystallinity may be evaluated through a full width at half maximum value of the rocking curve. Specifically, among silicon carbide wafers applied with an off angle which is an angle selected from a range of 0° to 10° with respect to (0001) surface of a silicon carbide ingot, when an off angle is 0°, the omega angle is 17.8111°, when an off angle is 4°, the omega angle is 13.811°, and when an off angle is 8°, the omega angle is 9.8111°.

The silicon carbide wafer 10 may be four inches or more, five inches or more, six inches or more, or eight inches or more. The diameter of the wafer may be twelve inches or less, or ten inches or less.

The silicon carbide wafer 10 may comprise a 4H silicon carbide.

The silicon carbide wafer 10 may be a wafer before the formation of an epitaxial layer in the surface. In an example, the silicon carbide wafer may be a wafer after being cut from a silicon carbide ingot before passing through flattening processing and a chemical mechanical polishing process.

Figure 13:
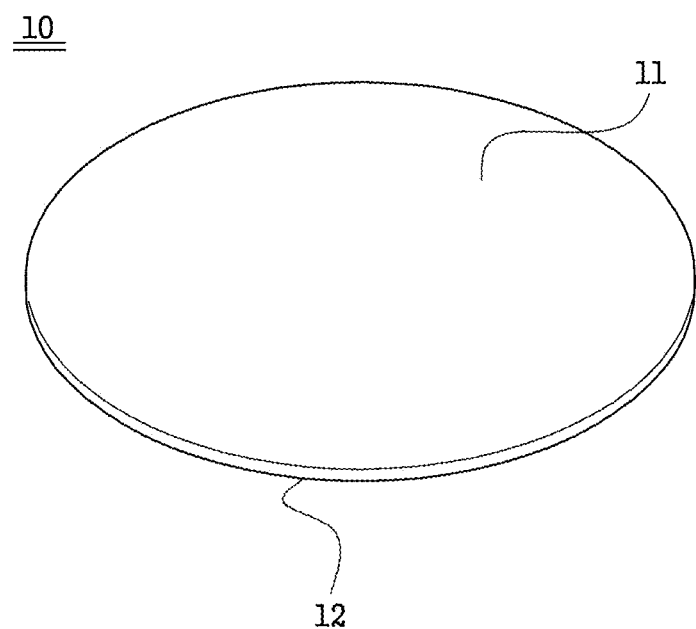
FIG. 13 is a conceptual view illustrating one example of a silicon carbide wafer, in accordance with one or more embodiments.

The silicon carbide wafer 10 may comprise Si plane as one side 11 where a silicon atom layer is shown on the surface and C plane as the other side 12 where a carbon atom layer is shown on the surface like an illustration of FIG. 13. When a silicon carbide wafer is manufactured by a cutting process from a silicon carbide ingot, it may be easily cut in an interface of a carbon atom layer and a silicon atom layer haven by a silicon carbon single crystal or in a direction parallel to the interface. Accordingly, a surface where carbon atoms are mainly exposed and a surface where silicon atoms are mainly exposed are shown on the cut surface.

Si plane as one side 11 of the silicon carbide wafer 10 may have an Ra roughness of 0.3 nm or less, or 0.2 nm or less. The one side may have an Ra roughness of 0.01 nm or more. A wafer having such a roughness range may improve electrical properties when an element is manufactured through subsequent processes.

The silicon carbide wafer may have a thickness of 100 μm to 900 μm, the thickness is not limited thereto and any thickness suitable to a semiconductor element can be applied.

Silicon Carbide Ingot 100

In a general aspect, a silicon carbide ingot 100, in accordance with one or more embodiments, is a silicon carbide ingot comprising, a front 102 and a rear 101 which is an opposite side thereof, wherein the rear may be cut from a silicon carbide seed crystal 110, the maximum height perpendicular to the rear may be 15 mm or more, the diameter of the rear Db and the circumference diameter of the front may have a ratio Df/Db of 0.95 to 1.17, and a line perpendicular to the rear from one side of the circumference of the rear, and an edge line linking one side of the front close to the one side of the circumference of the rear from a plane comprising the line perpendicular to the rear from one side of the circumference of the rear and a diameter of the rear may have an angle of −4° to 50°.

Figure 6:
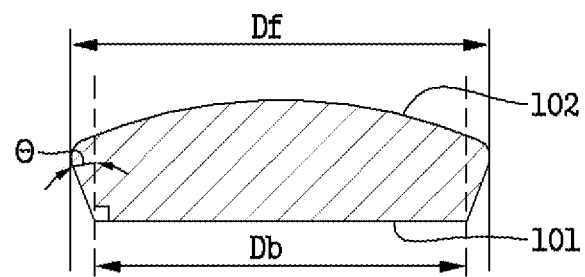
FIG. 6 is a conceptual view illustrating a silicon carbide ingot, in accordance with one or more embodiments.

Referring to FIG. 6, the silicon carbide ingot 100 may be manufactured through the manufacturing method of the silicon carbide ingot, and may be controlled to have a predetermined shape through a guide 120, a heater 600 (which is movable, and the moving speed thereof can be adjusted), a temperature difference, and the like equipped during manufacturing processes.

The rear region 101 of the silicon carbide ingot 100 may have a section that is substantially similar to a section of the silicon carbide seed crystal 110, the section may have a circular shape, and may have a diameter Db.

The front region of the silicon carbide ingot 102 may have a convex surface, or a plane, and may have a circumference of the edge and a diameter of the circumference Df.

The front of the silicon carbide ingot 120 may have a diameter of 178 mm or less, 170 mm or less, or 158 mm or less. A silicon carbide ingot having such a Df value can have an excellent crystal quality. The Df value range may be based on a silicon carbide seed crystal 110 having a diameter of 150 mm.

The silicon carbide ingot may have a ratio Df/Db of a diameter of the rear 101 Db and a diameter of the circumference of the front 102 Df of 0.95 to 1.17, or 1 to 1.1. Additionally, in this time the silicon carbide ingot 100 may have a maximum height of 15 mm or more, 18 mm or more, or 21.6 mm or more in a direction perpendicular to the rear 101. A silicon carbide ingot having such a diameter ratio and a height may be one whose internal stress occurrence is minimized and may show a good crystal quality.

Referring to FIG. 6, a line perpendicular to the rear region 101 from one side of the circumference of the rear region 101 and an edge line linking one side of the front region 102 close to the one side of the circumference of the rear region 101 from a plane comprising the line perpendicular to the rear from one side of the circumference of the rear and a diameter of the rear may have an angle of −4° to 50°, −1° to 40°, or 0.1° to 30°. A silicon carbide ingot being out of such a range may have a high possibility of generating cracks or defects in the interior, have a high possibility of generating a load when a wafer is processed, and have a possibility of reducing a usable effective area and a yield rate.

Additionally, the angle may be a tilted angle of an edge linked from one side of the circumference of the rear region 101 to one side of the front region 102 which is the closest to the one side of the circumference of the rear, based on a direction perpendicular to the rear as 0°, when viewed in a plane being in an orthogonal position to the rear 101 and comprising a diameter of the rear.

The silicon carbide ingot 100 may have a difference of 0.01 mm to 3 mm, or 0.01 mm to 2.9 mm between a center height and an edge in the front 102 which is an opposite side based on the rear 101.

The silicon carbide ingot 100 may have a micropipe density of $1/cm^2$ or less, $0.8/cm^2$ or less, $0.59/cm^2$ or less, or $0.1/cm^2$ or more.

The silicon carbide ingot 100 may have a basal plane dislocation density of $1300/cm^2$ or less, of $1100/cm^2$ or less, or of $980/cm^2$ or less.

The silicon carbide ingot may have an etch pit density of $12000/cm^2$ or less, or of $10000/cm^2$ or less.

The micropipe density, basal plane dislocation density and etch pit density may be calculated by cutting the silicon carbide ingot 100 to prepare a wafer, immersing the wafer in molten potassium hydroxide (KOH) under conditions of 500° C. and 5 minutes and etching the wafer, and then measuring the defects per unit area in the surface through an optical microscope, etc.

When the silicon carbide ingot 100 satisfies the above defect density range, so that a wafer having few defects can be provided, and when it is applied to an element, an element having excellent electrical or optical properties can be manufactured.

A silicon carbide wafer prepared by cutting the silicon carbide ingot 100 may have a bow absolute value of 50 μm or less, 48 μm or less, or 43 μm or less. The bow absolute value may be 5 μm or more. The bow measurement may be made by the same method as described in below experimental examples.

Hereinafter, while embodiments of the present disclosure will be described in more detail with reference to the accompanying examples, it is noted that examples are not limited to the same.

Examples 1 to 5—Manufacture of Silicon Carbide Ingot

As shown, in examples of a silicon carbide ingot manufacturing system and device, as illustrated in a in FIG. 3, a silicon carbide ingot powder as a raw material 300 was disposed at the lower portion 240 of an internal space of the reactor 200, and a silicon carbide seed crystal 110 was disposed at the upper portion of an internal space of the reactor 200. The silicon carbide seed crystal 110 was made of 4H-silicon carbide crystal having a diameter of 6 inches, and the C plane (000-1 plane) was fixed to face the silicon carbide raw material in the lower portion of internal space of the reactor 200. Additionally, a guide 120 was equipped in an external side of the silicon carbide seed crystal 110, and the guide unit was extended toward a perpendicular direction facing to a silicon carbide raw material from the silicon carbide seed crystal 110, and had an inner diameter surface tilted to the external side by 50° based on the perpendicular direction.

After the reactor 200 was sealed and the exterior surface of the reactor 200 was surrounded by a heat insulating material 400, the reactor 200 was disposed in a quartz tube 500 equipped with a heating coil disposed exterior to the reactor 200, which is a heater 600.

As illustrated in FIG. 2, the internal space of the reactor 200 was depressurized to be adjusted to a vacuum atmosphere, and was injected with argon gas to reach 760 torr, wherein the temperature of the internal space of the reactor 200 was raised to 1600° C. at a rate of 10° C./min. As a pre-growth process at the same time as decompression, the temperature was raised at a rate of 3° C./min, and the temperature of the lower portion of the internal space was set to 2350° C., which is the temperature of the maximum heating region of the heater 600. Thereafter, while maintaining the same conditions, the silicon carbide ingot was grown under the conditions of the moving speed, moving time, and moving distance of the heater 600 in Table 1.

After the growth, the temperature of the internal space of the reactor 200 was cooled to 25° C. at a rate of 5° C./min, at the same time, argon gas was injected so that the pressure in the internal space became 760 torr. Then, the formed silicon carbide ingot was cut and separated from the seed crystal.

Comparative Examples 1 and 2—Changing the Moving Speed of Heater

In the above example, except for changing the moving speed, moving time, and moving distance of the heater to the conditions shown in Table 1, it proceeded in the same manner as in the above embodiment.

Experimental Example—Measurement of Growing Angle, and Front and Rear Diameters of the Manufactured Silicon Carbide Ingot, and Bow Value of Silicon Carbide Wafer In a view of facing the front of silicon carbide ingots manufactured in respective Examples 1 to 5 and Comparative Examples 1 and 2 to be perpendicular to a growing direction as in FIG. 6, a maximum height of the front region 102 which is a growth end was measured by a height gauge, an angle between a line perpendicular to the rear region 101 from the edge of the rear and an edge line linking the rear and the front was measured, and a diameter of the circumference of the front region 102 was measured as illustrated in Table 1.

Additionally, silicon carbide ingots manufactured in the respective Examples 1 to 5 and Comparative Examples 1 and 2 were cut to have an off angle of 4° with (0001) surface, thereby preparing a wafer of 360 μm, and a wafer ground by a diamond wheel or the like was prepared. A bow value of this wafer was measured through a Flatmaster 200XRA device available from Corning Tropel and shown in Table 1.

TABLE 1

| Item | Example 1 | Example 2 | Example 3 | Example 4 | Example 5 | Comparative Example 1 | Comparative Example 2 |
|---|---|---|---|---|---|---|---|
| Moving Speed of Heater (mm/hr) | 0.1 | 0.1 | 0.1 | 0.1 | 0.2 | 0 | 0.05 |

TABLE 1-continued

| Item | Example 1 | Example 2 | Example 3 | Example 4 | Example 5 | Comparative Example 1 | Comparative Example 2 |
|---|---|---|---|---|---|---|---|
| Moving Speed of Heater (hr) | 90 | 100 | 100 | 80 | 100 | 0 | 50 |
| Moving Speed of Heater (mm) | 9 | 10 | 10 | 8 | 2 | 0 | 2.5 |
| The Height of Manufactured Ingot (mm) | 15 | 15.5 | 15.5 | 14 | 18 | 12 | 11 |
| Inclination Angle of the Edge (°) | 8 | 10 | 5 | 30 | −1 | 60 | 61 |
| Db(mm) | 150 | 150.5 | 150 | 150 | 154 | 150 | 150 |
| Df(mm) | 155 | 158 | 152 | 170 | 150 | 184 | 180 |
| Df/Db | 1.03 | 1.04 | 1.01 | 1.13 | 0.97 | 1.22 | 1.14 |
| Bow of Manufactured Wafer (μm) | 42 | 48 | 45 | −33 | −43 | 212 | 128 |

Df/Db: The ratio of a diameter of the circumference of the front (Df) and a diameter of the rear (Db) in a silicon carbide ingot.

Referring to Table 1, in examples in which a moving speed of a heater 600 is 0.1 mm/hr to 0.48 mm/hr, a center height of the front region which was an opposite side based on the rear region of an ingot (seed crystal surface) was 14 mm or more, an edge angle of inclination showed −4° to 50°, and a bow absolute value of a wafer manufactured from an ingot was 50 μm thereby being verified to be good.

In cases of comparative examples in which a heater 600 does not move, or a moving speed of a heater 600 is less than 0.1 mm/hr, the center height showed a value less than 14 mm, an edge angle of inclination was more than 50°, and a bow value of a wafer manufactured from a silicon carbide ingot also showed a not good value.

Example A—Manufacture of Silicon Carbide Ingot and Wafer

Referring to FIG. 4, in an illustrated example of a manufacturing device of a silicon carbide ingot, a silicon carbide powder implemented as a raw material 300 was charged in a lower portion of an internal space of a reactor 200, and a silicon carbide seed crystal 110 was disposed in an upper portion of the reactor 200. The silicon carbide seed crystal 110 was composed of 4H-silicon carbide crystal of six inches and C surface ((000-1) surface) was fixed to face a raw material in a lower portion of an internal space.

A reactor 200 was sealed, the exterior of the reactor 200 was surrounded by a heat insulating material 400. The reactor 200 was disposed inside a quartz tube 500 having a heating coil as a heater 600 equipped in the exterior of the quartz tube 500. The density of the heat insulating material 400 and the ratio Vc/Vi of a volume of the reactor Vc and a volume of the circumference part of a heat insulating material Vi surrounding the external surface of the reactor 200 was applied as described in below Table 1. Each volume was measured, or was calculated, through a three-dimension modeling program or the like.

The internal space of the reactor 200 was depressurized to be a vacuum atmosphere, and argon gas was injected to the internal space to reach a value of 760 torr. Thereafter, the internal space of the reactor 200 was depressurized again and simultaneously the temperature of the internal space of the reactor 200 was increased to a first temperature (1600° C.) at a rate of 7° C./min to 10° C./min. As a first growing process, heating of the internal space of the reactor 200 was performed to reach a second temperature, and a temperature difference of Table 1 at a rate of 3° C./min to 5° C./min with depressurizing at the same time. The same condition was maintained to grow a silicon carbide ingot for 80 to 140 hours.

After the growth, the temperature of the internal space of the reactor 200 was cooled to 25° C. at a rate of 5° C./min to 8° C./min and simultaneously argon or nitrogen gas was injected to the internal space of the reactor 200 to have a pressure of 760 torr, thereby cooling a silicon carbide ingot.

The circumference surface of the cooled silicon carbide ingot was ground to be processed as a shape having a regular external diameter, and cut to have any one of an angle among 0°, 4°, and 8° with (0001) surface of a silicon carbide ingot, thereby manufacturing a silicon carbide wafer having a thickness of 360 μm. After that, the silicon carbide wafer was ground to flatten the thickness, and subsequently processed by chemical mechanical polishing through silica slurry to prepare a silicon carbide wafer.

Examples B to D, and Comparative Examples A and B—Manufacture of Silicon Carbide Ingot and Wafer In the Example 1, the Vc/Vi, the upper temperature and temperature difference in the second temperature, and the density and non-resistivity of the heat insulating material were changed to be as described in Table A, thereby preparing a silicon carbide wafer.

TABLE A

| | Vc/Vi | Upper Temperature in the Second Temperature (° C.) | Lower Temperature in the Second Temperature (° C.) | Temperature Difference in the Second Temperature (° C.) | The Density of Heat Insulating Material (g/cc) | The Non-Resistivity of Heat Insulating Material (Ωm) |
|---|---|---|---|---|---|---|
| Example A | 0.1 | 2125 | 2330 | 205 | 0.15 | $2.5 \times 10^{-4}$ |
| Example B | 0.3 | 2123 | 2330 | 207 | 0.16 | $3.1 \times 10^{-3}$ |
| Example C | 0.5 | 2128 | 2330 | 202 | 0.17 | $1.0 \times 10^{-4}$ |

TABLE A-continued

| | Vc/Vi | Upper Temperature in the Second Temperature (° C.) | Lower Temperature in the Second Temperature (° C.) | Temperature Difference in the Second Temperature (° C.) | The Density of Heat Insulating Material (g/cc) | The Non-Resistivity of Heat Insulating Material (Ωm) |
|---|---|---|---|---|---|---|
| Example D | 0.7 | 2134 | 2330 | 196 | 0.17 | $5.0 \times 10^{-3}$ |
| Comparative Example A | 0.9 | 2173 | 2330 | 157 | 0.13 | $9.2 \times 10^{-3}$ |
| Comparative Example B | 1 | 2198 | 2330 | 132 | 0.29 | $6.3 \times 10^{-2}$ |

Figure 8:
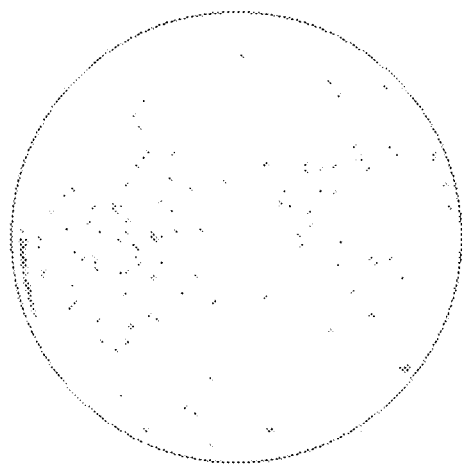
FIG. 8 is an image map illustrating micropipe defects in one side of a silicon carbide wafer of Comparative Examples A and B.
Figure 8:
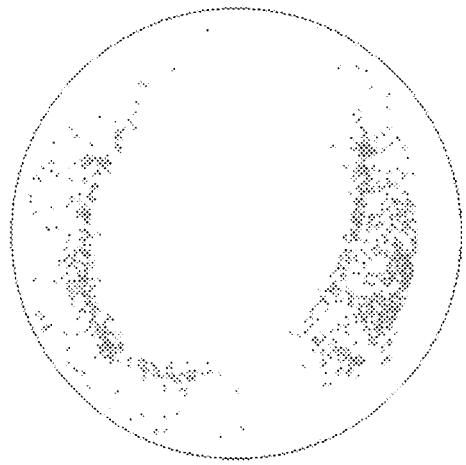

Vc: The Volume of Reactor, Vi: The Volume of Heat Insulating Material Circumference Part Experimental Example—Measurement of Micropipe and X-Ray Rocking Curve Full Width at Half Maximum of Silicon Carbide Wafer 1) Measurement of Micropipe Through a Candela 8520 device available from KLA-Tencor, an image map was formed with silicon carbide wafers prepared in the Examples A to D, and Comparative Examples A and B as illustrated in FIGS. 7 and 8, and the micropipe density thereof was measured.

2) Measurement of Rocking Curve Full Width at Half Maximum

By applying SmartLab High Resolution X-ray Diffraction (HRXRD) system available from Rigaku, [11-20] direction of silicon carbide wafers prepared in the Examples A to D, and Comparative Example A and B, was fitted to an X-ray route, an angle of an X-ray source and an X-ray detector was set to 2θ (35° to 36°), and after that an omega (ω or θ of an X-ray detector) angle was adjusted to be fitted to an off angle of a wafer to measure a rocking curve full width at half maximum. Specifically, an omega angle was 17.8111° based on an off angle of 0°, an omega angle was 13.811° based on an off angle of 4°, an omega angle was 9.8111° based on an off angle of 8°, and the values were shown in Table B.

TABLE B

| | MP Density (/cm$^2$) | Rocking Curve Peak Angle and Full Width at Half Maximum |
|---|---|---|
| Example A | 0.13 | 17.81° ± 0.2° |
| Example B | 0.12 | 13.81° ± 0.08° |
| Example C | 0.06 | 17.81° ± 0.05° |
| Example D | 0.18 | 13.81° ± 0.10° |
| Comparative Example A | 1.16 | 17.81° ± 1.8° |
| Comparative Example B | 8.16 | 17.81° ± 1.7° |

MP: Micropipe

Referring to Table A and Table B, in a case of an Example applying the optimum Vc/Vi, temperature difference, heat insulating material density, and heat insulating material non-resistivity when a silicon carbide ingot is manufactured, it can be verified that a micropipe density is remarkably lowered, and a full width at half maximum of a rocking curve is small thereby having a more excellent crystal characteristic. In cases of Comparative Examples A and B, it can be verified that the curvature, stress occurrence, and the like become excessive during a growth process of a silicon carbide ingot, thereby showing a result which is not good in the crystal quality and defect characteristic.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A silicon carbide ingot manufacturing method, the method comprising:

a preparation operation of disposing a silicon carbide raw material and a silicon carbide seed crystal in an internal space of a reactor, and adjusting the internal space of the reactor to a vacuum atmosphere;

a proceeding operation of injecting an inert gas into the internal space of the reactor, sublimating the silicon carbide raw material in the internal space of the reactor through a heater configured to surround the reactor, and configured to induce a silicon carbide ingot to be grown; and a cooling operation of cooling a temperature of the internal space of the reactor to room temperature, cutting a rear region of the silicon carbide ingot in contact with the seed crystal to retrieve the silicon carbide ingot;

wherein the internal space of the reactor comprises a guide disposed to surround a circumferential surface of the silicon carbide seed crystal with a predetermined interval, wherein the guide is configured to extend toward a direction that faces a silicon carbide raw material from the silicon carbide seed crystal, the guide is configured to have a guide angle of inclination which is tilted to an external side of the silicon carbide seed crystal by −4° to 50° when a virtual reference line connecting one side of the silicon carbide seed crystal and the silicon carbide raw material in a shortest distance is designated as 0°, wherein the proceeding operation comprises a procedure in which the heater is moved, and wherein the moving of the heater comprises moving the heater to a relative position which becomes more distant at a rate of 0.1 mm/hr to 0.48 mm/hr based on the silicon carbide seed crystal, wherein:

the silicon carbide ingot comprises a front region and the rear region, the silicon carbide ingot has a maximum height equal to or greater than 15 mm in a direction perpendicular to the rear region, the silicon carbide ingot has a ratio, Df/Db, of 0.95 to 1.17, wherein Db is a diameter of the rear region, and Df is a diameter of the circumference of the front region, and the silicon carbide ingot has an angle of −4° to 50° between a line perpendicular to the rear region from one side of the circumference of the rear region, and an edge line linking one side of the front region, which is close to the one side of the circumference of the rear region, from a plane comprising the line perpendicular to the rear region from one side of the circumference of the rear region and the diameter of the rear region, wherein the reactor comprises a heat insulating material configured to surround an external surface of the reactor, wherein the heat insulating material comprises a heat insulating circumference part that surrounds a circumferential surface of the reactor, and wherein a volume of the reactor Vc and a volume of the heat insulating circumference part Vi have a ratio Vc/Vi of 0.05 to 0.8, and wherein the heat insulating circumference part of the heat insulating material has a thickness of 200 mm to 600 mm.

2. The method of claim 1, wherein the angle of inclination of the guide is 4° to 25°.

3. The method of claim 1, wherein the guide that surrounds the circumferential surface of the silicon carbide seed crystal has a height equal to or greater that 30 mm, based on a direction connecting one side of the silicon carbide seed crystal and the silicon carbide raw material in a shortest distance.

4. The method of claim 1, wherein the proceeding operation sequentially comprises a pre-growth process and a growth process, wherein the pre-growth process sequentially comprises a first process, a second process, and a third process, wherein the first process changes the vacuum atmosphere of the preparation operation to an inert atmosphere, wherein the second process raises the temperature of the internal space of the reactor with the heater, and wherein the third process depressurizes a pressure of the internal space of the reactor to reach a growth pressure based on the heating of the internal space of the reactor so that the temperature of the internal space of the reactor reaches the growth temperature, wherein the growth process maintains the internal space of the reactor at the growth temperature and the growth pressure, and inducing the ingot to grow, wherein a moving of the heater is performed in the growth process, wherein a temperature difference is a difference between an upper temperature of the internal space of the reactor and a lower temperature of the internal space of the reactor, and wherein the temperature difference in the growth process is 110° C. to 160° C.

5. A silicon carbide ingot manufacturing method, the method comprising:

a preparation operation of disposing a silicon carbide raw material and a silicon carbide seed crystal in an internal space of a reactor, and adjusting the internal space of the reactor to a vacuum atmosphere;

a proceeding operation of injecting an inert gas into the internal space of the reactor, sublimating the silicon carbide raw material in the internal space of the reactor through a heater configured to surround the reactor, and configured to induce a silicon carbide ingot to be grown; and a cooling operation of cooling a temperature of the internal space of the reactor to room temperature, cutting a rear region of the silicon carbide ingot in contact with the seed crystal to retrieve the silicon carbide ingot;

wherein the internal space of the reactor comprises a guide disposed to surround a circumferential surface of the silicon carbide seed crystal with a predetermined interval, wherein the guide is configured to extend toward a direction that faces a silicon carbide raw material from the silicon carbide seed crystal, the guide is configured to have a guide angle of inclination which is tilted to an external side of the silicon carbide seed crystal by −4° to 50° when a virtual reference line connecting one side of the silicon carbide seed crystal and the silicon carbide raw material in a shortest distance is designated as 0°, wherein the proceeding operation comprises a procedure in which the heater is moved, and wherein the moving of the heater comprises moving the heater to a relative position which becomes more distant at a rate of 0.1 mm/hr to 0.48 mm/hr based on the silicon carbide seed crystal, wherein:

the silicon carbide ingot comprises a front region and the rear region, the silicon carbide ingot has a maximum height equal to or greater than 15 mm in a direction perpendicular to the rear region, the silicon carbide ingot has a ratio, Df/Db, of 0.95 to 1.17, wherein Db is a diameter of the rear region, and Df is a diameter of the circumference of the front region, and the silicon carbide ingot has an angle of −4° to 50° between a line perpendicular to the rear region from one side of the circumference of the rear region, and an edge line linking one side of the front region, which is close to the one side of the circumference of the rear region, from a plane comprising the line perpendicular to the rear region from one side of the circumference of the rear region and the diameter of the rear region, wherein the reactor comprises a heat insulating material configured to surround an external surface of the reactor, wherein the heat insulating material comprises a heat insulating circumference part that surrounds a circumferential surface of the reactor, and wherein a volume of the reactor Vc and a volume of the heat insulating circumference part Vi have a ratio Vc/Vi of 0.05 to 0.8, wherein the proceeding operation sequentially comprises a pre-growth process and a growth process, wherein the pre-growth process sequentially comprises a first process, a second process, and a third process, wherein the first process changes the vacuum atmosphere of the preparation operation to an inert atmosphere, wherein the second process raises the temperature of the internal space of the reactor with the heater, and wherein the third process depressurizes a pressure of the internal space of the reactor to reach a growth pressure based on a heating of the internal space of the reactor so that the temperature of the internal space of the reactor reaches a growth temperature, wherein the growth process maintains the internal space of the reactor at the growth temperature and the growth pressure, and inducing the ingot to grow, wherein a moving of the heater is performed in the growth process, wherein a temperature difference between a temperature of an upper portion of the internal space of the reactor and a temperature of a lower portion of the internal space of the reactor during the growth process is 160° C. to 240° C.

* * * * *